(12) United States Patent
Morishita et al.

(10) Patent No.: US 8,599,968 B2
(45) Date of Patent: Dec. 3, 2013

(54) SAMPLING CIRCUIT AND RECEIVER UTILIZING THE SAME

(75) Inventors: Yohei Morishita, Tokyo (JP); Noriaki Saito, Tokyo (JP); Yoshito Shimizu, Osaka (JP)

(73) Assignee: Panasonic Corporation, Osaka (JP)

( * ) Notice: Subject to any disclaimer, the term of this patent is extended or adjusted under 35 U.S.C. 154(b) by 323 days.

(21) Appl. No.: 13/121,244

(22) PCT Filed: Dec. 4, 2009

(86) PCT No.: PCT/JP2009/006646
§ 371 (c)(1),
(2), (4) Date: Mar. 28, 2011

(87) PCT Pub. No.: WO2010/064451
PCT Pub. Date: Jun. 10, 2010

(65) Prior Publication Data
US 2011/0176640 A1 Jul. 21, 2011

(30) Foreign Application Priority Data
Dec. 4, 2008 (JP) .................................. 2008-310001

(51) Int. Cl.
*H03D 3/00* (2006.01)

(52) U.S. Cl.
USPC ...................................................... 375/322

(58) Field of Classification Search
USPC ...................................................... 375/322
See application file for complete search history.

(56) References Cited

U.S. PATENT DOCUMENTS

| | | | |
|---|---|---|---|
| 6,856,925 B2* | 2/2005 | Muhammad et al. | 702/75 |
| 7,623,838 B2* | 11/2009 | Staszewski et al. | 455/319 |
| 7,750,749 B2* | 7/2010 | Jones | 332/105 |
| 7,973,586 B2* | 7/2011 | Hosokawa et al. | 327/355 |
| 8,027,657 B2* | 9/2011 | Staszewski et al. | 455/323 |
| 8,229,987 B2* | 7/2012 | Hosokawa et al. | 708/313 |
| 2003/0035499 A1 | 2/2003 | Staszewski et al. | |
| 2005/0233725 A1 | 10/2005 | Muhammad et al. | |
| 2007/0275684 A1* | 11/2007 | Harada et al. | 455/185.1 |
| 2008/0112508 A1 | 5/2008 | Ishizaki et al. | |
| 2008/0112519 A1* | 5/2008 | Jung et al. | 375/350 |
| 2009/0274221 A1* | 11/2009 | Katayama et al. | 375/260 |
| 2009/0322418 A1* | 12/2009 | Burke | 327/552 |

(Continued)

FOREIGN PATENT DOCUMENTS

| | | |
|---|---|---|
| JP | 2006-211153 | 8/2006 |
| JP | 2008-99224 | 4/2008 |

(Continued)

OTHER PUBLICATIONS

U.S. Appl. No. 13/120,945, filed Mar. 25, 2011, Yohei Morishita.

*Primary Examiner* — Juan A Torres
(74) *Attorney, Agent, or Firm* — Greenblum & Bernstein, P.L.C.

(57) ABSTRACT

A sampling circuit and a receiver have a high level of filter design flexibility and excellent image rejection characteristics. Signals with phases that differ by 90° are sampled using an IQ generating circuit and are weighted by each of multiple parallel-connected discrete-time circuits, and the result of addition by an output adding circuit is ultimately output. Alternatively, a configuration in which the multiple parallel-connected discrete-time circuits and the output adding circuit are cascade-connected is adopted, so that frequency characteristics having an attenuation pole to one side can be achieved and excellent image rejection characteristics can be obtained.

19 Claims, 25 Drawing Sheets

(56) References Cited

U.S. PATENT DOCUMENTS

| | | |
|---|---|---|
| 2010/0109746 A1 | 5/2010 | Hosokawa et al. |
| 2010/0248675 A1 | 9/2010 | Hosokawa et al. |
| 2010/0311375 A1 | 12/2010 | Hosokawa et al. |
| 2011/0170640 A1* | 7/2011 | Morishita .................... 375/340 |

FOREIGN PATENT DOCUMENTS

| | | |
|---|---|---|
| WO | 2006/046632 | 5/2006 |
| WO | 2007/148693 | 12/2007 |
| WO | 2008/129791 | 10/2008 |
| WO | 2009/075105 | 6/2009 |

\* cited by examiner

IRR:35.1dB RW:0.1dB

IRR:18.1dB RW:2.6dB

IRR:6.60dB RW:0.8dB

SAMPLING CIRCUIT AND RECEIVER UTILIZING THE SAME

The disclosure of Japanese patent application number 2008-310001, filed on Dec. 4, 2008, including the specification, drawings and abstract, is incorporated herein by reference in its entirety.

TECHNICAL FIELD

The present invention relates to a sampling circuit and a receiver, and, more particularly, to a technology to perform received signal processing such as frequency conversion, filter processing and so forth by means of discrete time analog processing.

BACKGROUND ART

A configuration has been known, as prior art, that performs reception processing by means of direct discrete time sampling of a high-frequency signal with the aim of achieving small size and low power consumption of a receiver and integrating the analog signal processing section and digital signal processing section (see Patent Literature 1).

FIG. 1 shows the overall configuration of a sampling circuit disclosed in Patent Literature 1. FIG. 2 shows control signals inputted to the circuit shown in FIG. 1. The sampling circuit shown in FIG. 1 performs frequency conversion on a received analog RF signal using a multi-tap direct sampling mixer to obtain a discrete time analog signal. To be more specific, electrical charge transfer between capacitors included in the sampling circuit in FIG. 1 realizes filter characteristics resulting in the product of an FIR (finite impulse response) filer and an IIR (infinite impulse response) filter. Characteristics around the passband are determined based on second-order IIR filter characteristics. FIG. 3A shows an example of wideband frequency characteristics, and FIG. 3B shows an example of narrowband frequency characteristics nearby the passband.

In addition, as a prior art based on the above-described configuration, a configuration allowing image rejection has been known (Patent Literature 2).

FIG. 4 shows the overall configuration of the sampling circuit disclosed in Patent Literature 2. FIG. 5 shows an example of frequency characteristics obtained by the circuit shown in FIG. 4 (here local (LO) frequency $f_{LO}$=800 MHz). The frequency characteristics exhibit bilateral asymmetry centered around the LO frequency and allow image rejection.

CITATION LIST

Patent Literature

PTL 1
U.S. Patent Application Publication No. 2003/0035499
PTL 2
U.S. Patent Application Publication No. 2005/0233725

SUMMARY OF INVENTION

Technical Problem

However, the above-described prior art has the following problems.

The conventional sampling circuit shown in FIG. 1 is not suitable for image rejection because the gain is maximized when the LO frequency and an radio frequency (RF) input frequency match, and it is possible to realize only symmetric frequency characteristics centered around the LO frequency.

If the configuration shown in FIG. 4 is adopted, it is possible to realize asymmetric characteristics centered around the LO frequency to perform image rejection. However, with the configuration shown in FIG. 4, there is no variable parameter, except for the capacitance ratio between a history capacitor and a rotate capacitor. Therefore, the maximum gain position and the cutoff frequency are determined by this parameter, and can not be set individually. Accordingly, it is not possible to provide a satisfactory image suppression ratio. For example, when a digital television (DTV) receiver is formed by the low intermediate frequency (LOW-IF) scheme, although an image rejection mixer having an image suppression ratio equal to or greater than 30 dB is required, it is possible to provide only an image suppression ratio of about 7 dB with the conventional configuration.

Moreover, it is possible to design only constant terms in numerators, so that it is not possible to set zero in a transfer function and also obtain the sufficient amount of attenuation by attenuation poles.

It is therefore an object of the present invention to provide a sampling circuit and a receiver having a flexibility of filter design and excellent image rejection characteristics.

Solution to Problem

The sampling circuit according to the present invention adopts a configuration to include: an in-phase and quadrature IQ generating circuit that outputs an in-phase I signal and a quadrature (Q) signal having phases 90 degrees shifted from one another, by sampling an input signal; a plurality of electrical charge sharing circuits connected to an output stage of the IQ generating circuit in parallel; a adding circuit that is arranged behind an output stage of the plurality of electrical charge sharing circuits and adds outputs from the electrical charge sharing circuits; and a digital control unit that outputs control signals to control operation of the electrical charge sharing circuits and operation of the adding circuit.

Advantageous Effects of Invention

According to the present invention, it is possible to realize filter design with a high flexibility and excellent image rejection characteristics.

DESCRIPTION OF EMBODIMENTS

Now, embodiments of the present invention will be described in detail with reference to the accompanying drawings.

Embodiment 1

Figure 6:
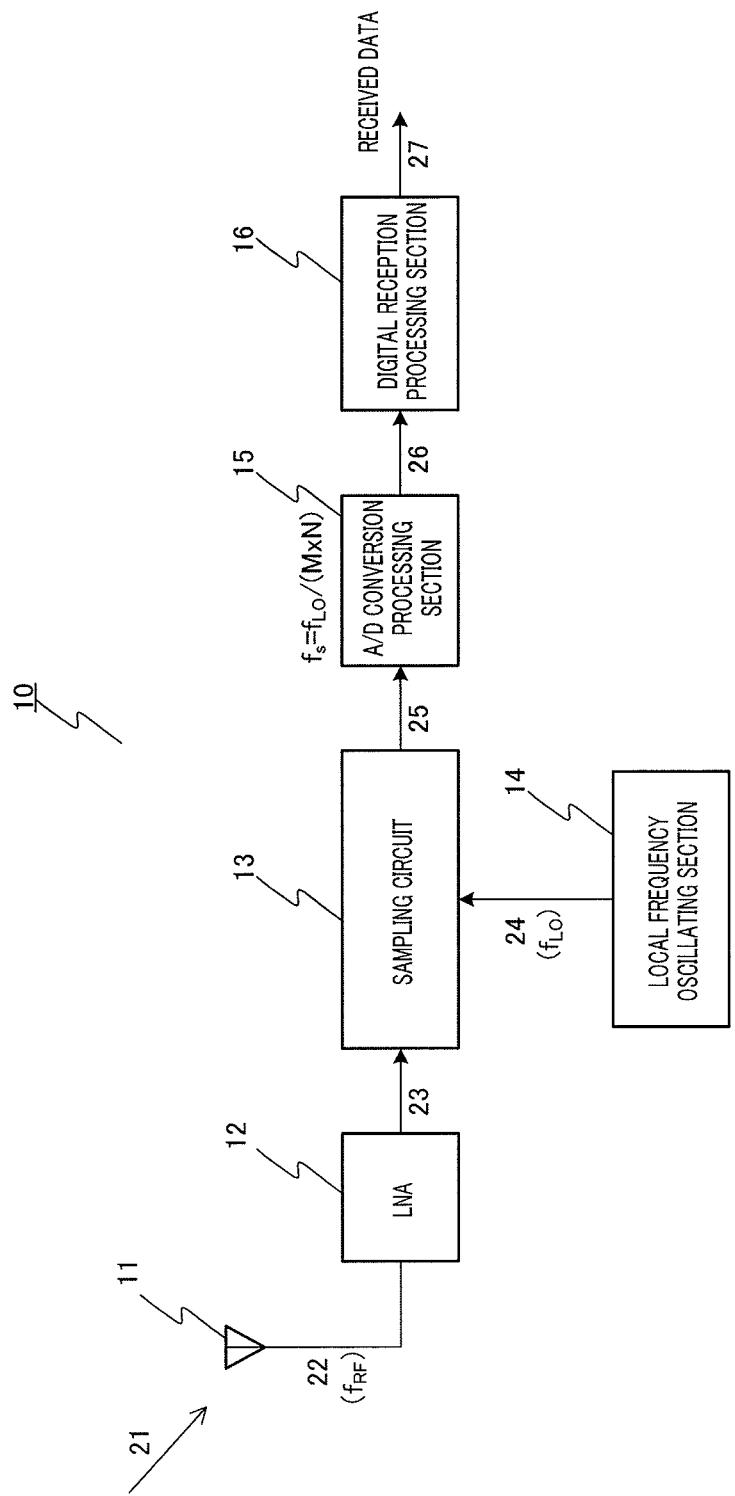
FIG. 6 is a block diagram showing a configuration of a sampling receiver according to Embodiment 1 of the present invention.

FIG. 6 shows the configuration of a sampling receiver according to the present embodiment. Discrete-time sampling receiver 10 has antenna 11, LNA (low noise amplifier) 12, sampling circuit 13, local frequency oscillating section 14, A/D (analog to digital) conversion processing section 15 and digital reception processing section 16.

This sampling receiver 10 receives electromagnetic wave 21 transmitted at carrier frequency $f_{RF}$, and applies discrete-time frequency conversion and filter processing on this received signal to extract a desired signal component. Then, sampling receiver 10 performs digital reception processing by converting the extracted desired signal component to a digital signal, and outputs resultant received data 27.

Antenna 11 receives electromagnetic wave 21 transmitted at carrier frequency ($f_{RF}$) from a transmitting station (not shown) and converts it to analog RF signal 22. LNA 12 amplifies analog RF signal 22 and outputs the result.

Sampling circuit 13 receives amplified analog RF signal and local frequency signal 24 as input, performs filter processing by performing discrete-time frequency conversion on analog RF signal 23 using local frequency signal ($f_{LO}$) 24 to obtain baseband signal 25 resulting in extracting a desired signal component, and outputs baseband signal 25.

Local frequency oscillating section 14 generates local frequency signal ($f_{LO}$) 24 used in sampling processing and frequency conversion processing, and outputs it to sampling circuit 13.

A/D conversion processing section 15 quantizes an inputted baseband signal into digital values at a predetermined sampling frequency and outputs converted digital baseband signal 26.

Digital reception processing section 16 performs predetermined digital reception processing, including demodulation, decoding and so forth, on inputted digital baseband signal 26, and outputs resultant received data 27.

Figure 7:
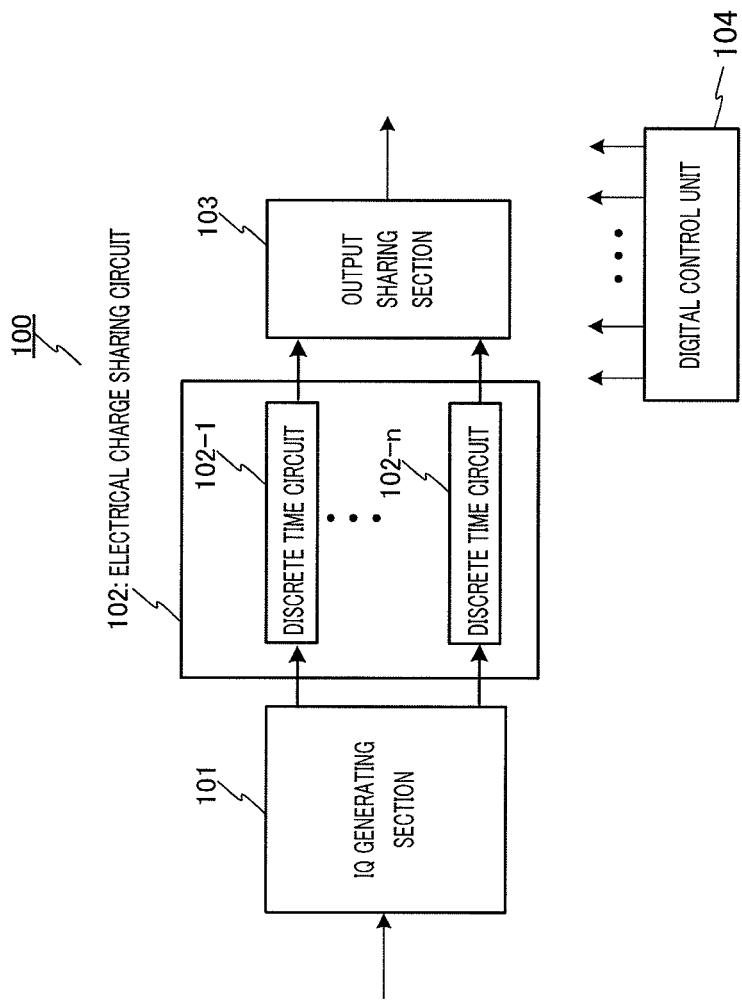
FIG. 7 is a block diagram showing a configuration of a sampling circuit according to Embodiment 1.

FIG. 7 shows the configuration of sampling circuit 100 according to the present embodiment. Here, sampling circuit 100 in FIG. 7 is equivalent to sampling circuit 13 in FIG. 6.

In FIG. 7, IQ generating circuit 101 performs frequency conversion on a received high-frequency signal to convert to a baseband signal by switching an inputted current signal. By controlling the duration of "on", a signal is sampled with a plurality of sampling clocks having the phases 90 degrees shifted from each other to generate a sequence of sample values having the phases 90 degrees shifted from each other. Electrical charge sharing circuit 102 has discrete time circuits 102-1 to 102-n, each of which has a passive circuit configuration including a switch and a capacitor. The element values of discrete time circuits 102-1 to 102-n are set to specific values, respectively, and finally, added in output adding circuit 103 to realize required frequency characteristics.

Figure 8:
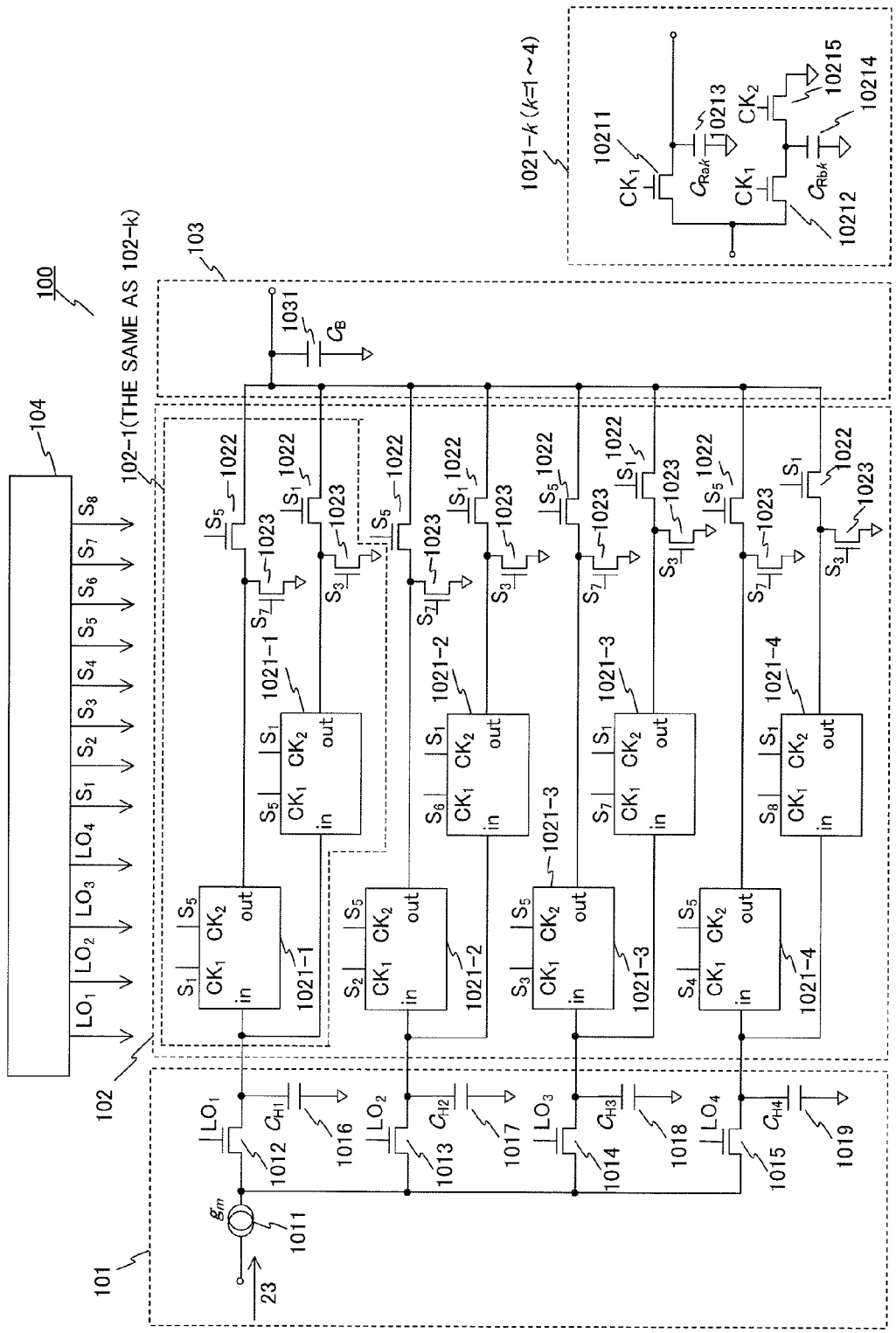
FIG. 8 is a connection diagram showing the configuration of the sampling circuit according to Embodiment 1.

FIG. 8 shows a specific example of sampling circuit 100. First, the configuration of sampling circuit 100 will be explained, and next, the operation will be explained.

Sampling circuit 100 has IQ generating circuit 101, electrical charge sharing circuit 102, output adding circuit 103 and digital control unit 104.

IQ generating circuit 101 has TA (transconductance amplifier) 1011, sampling switches 1012 to 1015 and history capacitors 1016 to 1019. Electrical charge sharing circuit 102 has discrete time circuits 102-1 to 102-n, and discrete time circuit 102-k (k=1 to 4) has rotate capacitor unit 1021-k, dump switch 1022 and reset switch 1023. Each of rotate capacitor units 1021-k (k=1 to 4) has integration switch 10211 and 10212, main rotate capacitors 10213 and 10214, and release switch 10215.

As shown in FIG. 8, control signals $S_1$ to $S_8$ generated in digital control unit 104 are supplied to integration switches, release switches, a dump switch and a reset switch. Here, the capacitance values of main rotate capacitors 10213 and 10214 are set to provide desired characteristics in each rotate capacitor units 1021-k (k=1 to 4). The capacitance values of main rotate capacitors 10213 and 10214 may be different or the same between rotate capacitor unit 1021-k.

Output adding circuit 103 has buffer capacitor 1031. Here, output adding circuit 103 may not be necessarily realized by a passive configuration using buffer capacitor 1031. For example, it is possible to prepare the same number of buffer capacitors 1031 as the number of parallel discrete time circuits, and output signals by means of an adding circuit using an operational amplifier.

Here, the present invention does not limit what circuit configuration after buffer capacitor 1031 is. For example, a circuit configuration is possible where a discrete signal value defined by the amount of electrical charge accumulated in buffer capacitor 1031 is quantized into a digital value while sampling and holding the discrete signal value as is, and then digital signal processing is performed. In addition, for example, another configuration is possible where a discrete signal value defined by the amount of electrical charge accumulated in buffer capacitor 1031 is converted to a voltage again, and then signal processing is performed.

Based on a reference local frequency obtained from local frequency oscillating section 14 (FIG. 6), digital control unit 104 generates and supplies control signals to sampling switches 1012 to 1015 in IQ generating circuit 101, integration switches 10211 and 10212 and release switch 10215 in each of rotate capacitor units 1021, dump switch 1022 and reset switch 1023.

Figure 9:
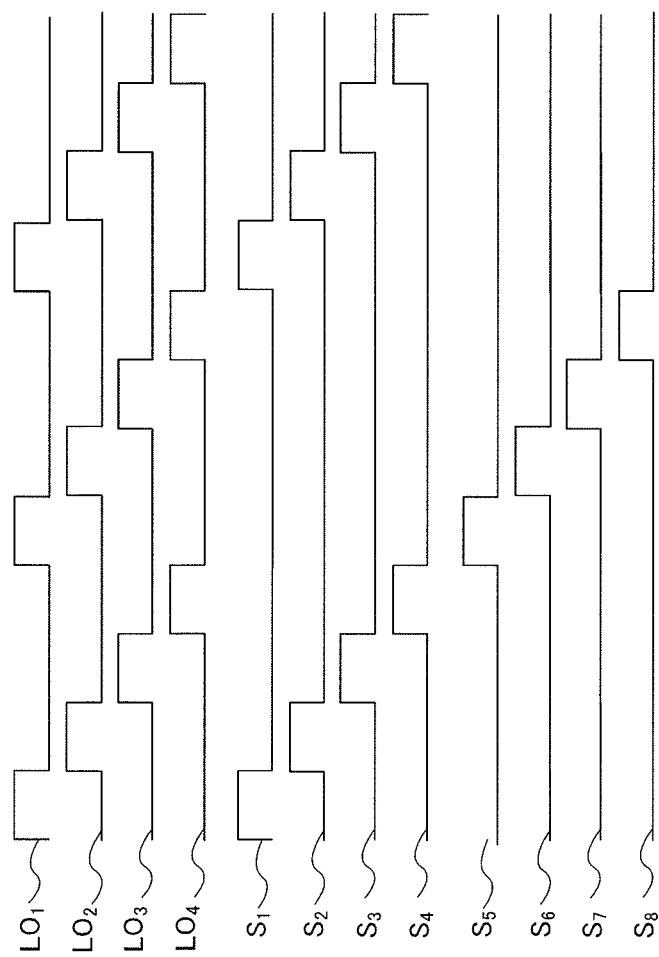
FIG. 9 is a timing chart explaining control signals according to Embodiment 1.

FIG. 9 is a timing chart showing control signals outputted from digital control unit 104. Local signals $LO_1$ to $LO_4$ are high at times shifted from each other, and a period of time in which $LO_1$ to $LO_4$ are high is approximately ¼ of an RF signal period. Also control signals $S_1$ to $S_8$ are high at times shifted from each other.

Here, with the present embodiment, capacitors for feedback control, among components disclosed in Patent Literature 1 and control signals therefor, are not limited to the present invention, and the illustration and descriptions are omitted for ease of explanation.

Next, operation of sampling circuit 100 according to the present embodiment will be explained.

First, TA (transconductance amplifier) 1011 converts inputted analog RF signal 23 to an analog RF current signal. Sampling switches 1012 to 1015 sample the analog RF current signal using four-phase local frequency signals 24 (FIG. 6) which are high at times shifted from each other and have a high level period ¼ of a local signal period.

Figure 10A:
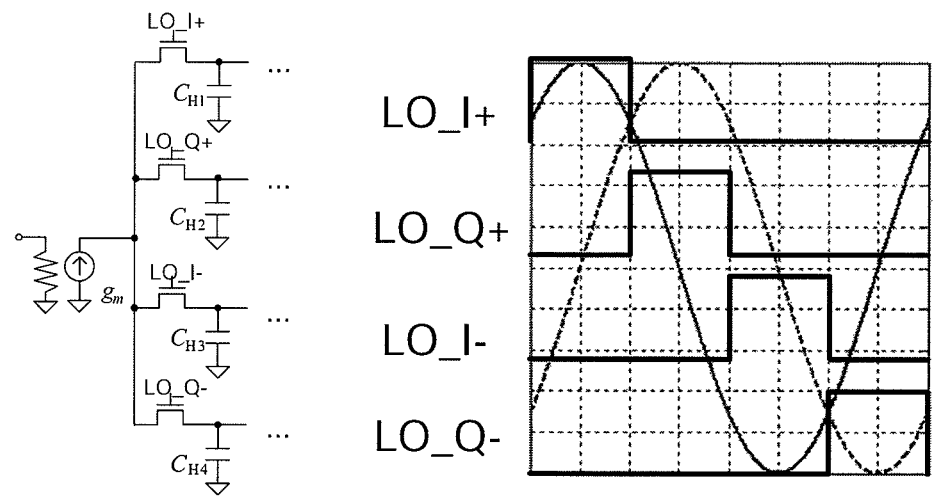
FIG. 10 is a connection diagram showing an IQ generating circuit according to Embodiment 1.
Figure 10B:
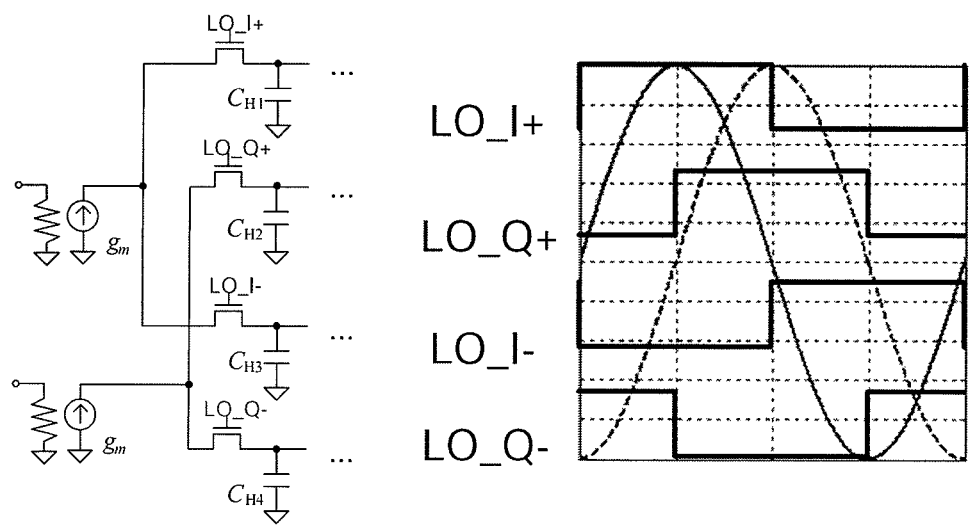

It is possible to obtain four-phase signals 90 degrees shifted from one another by sampling an analog RF current signal using local frequency signals having phases 90 degrees shifted from each other. This situation is shown in FIG. 10A. Implementation of IQ generating circuit 101 may not be limited to the configuration shown in FIG. 8. As shown in FIG. 10B, another configuration is possible where IQ generating circuit 101 generates four-phase 50% duty ratio control signals having phases 90 degrees shifted from one another.

First, the operation at the timing each of signals $S_1$ to $S_4$ enters the high period, will be explained.

IQ generating circuit 101 and left rotate capacitor units 1021-1 to 1021-4 in discrete time circuit 102-$k$ perform IIR filtering at the same time of sampling operation.

First, during $LO_1$ being in the high level period, history capacitor 1016, and main rotate capacitors 10213 and 10214 in rotate capacitor unit 1021-1 integrate electrical charge of a sampling signal. Next, during $LO_2$ being in the high level period, history capacitor 1017, and main rotate capacitors 10213 and 10214 in rotate capacitor unit 1021-2 integrate electrical charge of a sampling signal. Next, during $LO_3$ being in the high level period, history capacitor 1018, and main rotate capacitors 10213 and 10214 in rotate capacitor unit 1021-3 integrate electrical charge of a sampling signal. Finally, during $LO_4$ being in the high level period, history capacitor 1019, and main rotate capacitors 10213 and 10214 in rotate capacitor unit 1021-4 integrate electrical charge of a sampling signal. As the initial state of each of the above-described current integration, history capacitors 1016 to 1019 hold the electrical charge one LO period before, so that it is possible to perform IIR filtering operation.

In addition, at the timing $S_1$ enters the high level period, main rotate capacitor 10213 in each of right rotate capacitor units 1021-1 to 1021-4 in discrete time circuit 102-$k$ shares electrical charge with buffer capacitor 1031 via dump switch 1022 to determine an output voltage. Simultaneously, at the timing $S_1$ enters the high level period, sub-rotate capacitor 10214 in each of right rotate capacitor units 1021-1 to 1021-4 discrete time circuit 102-$k$ is grounded via release switch 10215 to discharge the electrical charge. At the timing $S_3$ enters the high level period, main rotate capacitor 10213 in each of right rotate capacitor units 1021-1 to 1021-4 in discrete time circuit 102-$k$ is grounded via reset switch 1023 to discharge the electrical charge.

Next, the timing each of $S_5$ to $S_8$ enters the high level period will be explained. At this timing, each of right rotate capacitor units 1021-1 to 1021-4 in discrete time circuit 102-$k$ performs sampling operation. Simultaneously, at the timing $S_5$ enters the high level period, main rotate capacitor 10213 in each of left rotate capacitor units 1021-1 to 1021-4 shares electrical charge with buffer capacitor 1031 to determine an output voltage. Simultaneously, at the timing $S_5$ enters the high level period, sub-rotate capacitor 10214 in each of left rotate capacitor unit 1021-1 to 1021-4 in discrete time circuit 102-$k$ is grounded to discharge the electrical charge, and, at the timing $S_3$ enters the high level period, main rotate capacitor 10213 in each of left rotate capacitor unit 1021-1 to 1021-4 in discrete time circuit 102-$k$ is grounded to discharge the electrical charge.

In addition, by sharing electrical charge with buffer capacitor 1031, the electrical charge in main rotate capacitor 10213 in each of main rotate capacitors 1021-1 to 1021-4 are added and operation as an adding circuit is performed. At this time, the electrical charge one LO period before is held in buffer capacitor 1031, so that it is possible to perform IIR filtering.

It is possible to describe the overall transfer function as the following equations.

(Equation 1)

$$T = T_{IIR} \cdot \frac{\sum_{k=1}^{4} C_{Rak}}{\sum_{k=1}^{4} C_{Rak} + C_B(1 - z^{-1})} \quad [1]$$

(Equation 2)

$$T_{IIR} = \frac{g_m T_{LO}}{\pi\sqrt{2} \sum_{k=1}^{4} C_{Rak}} \cdot$$

$$\left( \frac{C_{Ra1}}{C_{Ra1} + C_{Rb1} + C_{H1}(1-z^{-1})} + \frac{jC_{Ra2}}{C_{Ra2} + C_{Rb2} + C_{H2}(1-z^{-1})} + \frac{C_{Ra3}}{C_{Ra3} + C_{Rb3} + C_{H3}(1-z^{-1})} + \frac{jC_{Ra4}}{C_{Ra4} + C_{Rb4} + C_{H4}(1-z^{-1})} \right)$$

Here, in equation 1 and equation 2, $T_{LO}$ is the sampling period of local signals LO inputted to sampling switches 1012 to 1015, and $g_m$ is the transconductance value of TA (transconductance amplifier) 1011. $C_{Hk}$ is the capacitance value of each of history capacitors 1016 to 1019. $C_{Rak}$ is the capacitance value of main rotate capacitor 10213 in each of rotate capacitor units 1021-1 to 1021-4, and $C_{Rbk}$ is the capacitance value of sub-rotate capacitor 10214 in each of rotate capacitor units 1021-1 to 1021-4.

Here, note that if circuit element values are simply set in the transfer functions shown represented by equation 1 and equation 2, it is not possible to obtain desired filter frequency response characteristics. A method of determining circuit element values to obtain desired filter frequency response characteristics will be described later.

First, an example of the method of determining circuit element values in equation 1 and equation 2 will be shown.

First, coefficient values of the prototype of a transfer function represented by equation 3 will be considered.

(Equation 3)

$$T_{proto} = \sum_{k=1}^{2} \left( \frac{a_k}{b_k + 1 - z^{-1}} \right) \quad [2]$$

Here, it is possible to select any complex number as $a_k$. $b_k$ is any positive real number corresponding to the cutoff frequency of a first-order IIR filter. It is possible to derive coefficient values of the transfer function having attenuation poles at any frequency $f_N$, from the following equation.

(Equation 4)

$$\begin{bmatrix} a_1 \\ a_2 \end{bmatrix} = \begin{bmatrix} b_2 + 1 - z_N^{-M} & b_1 + 1 - z_N^{-M} \\ 1/b_1 & 1/b_2 \end{bmatrix} \begin{bmatrix} 0 \\ A \end{bmatrix} \quad [3]$$

Here, $z_N = \exp(j2\pi f_N T_{LO})$ is arbitrary complex number correspond to the attenuation pole frequency in complex plane. Here, for example, assume that $b_2 = lb_1$ and A, l, $b_1$ are any positive real numbers, it is possible to calculate $a_1$ and $a_2$.

By comparing equation 3 having coefficients determined by equation 4 with equation 2, circuit element values are determined.

Figure 11B:
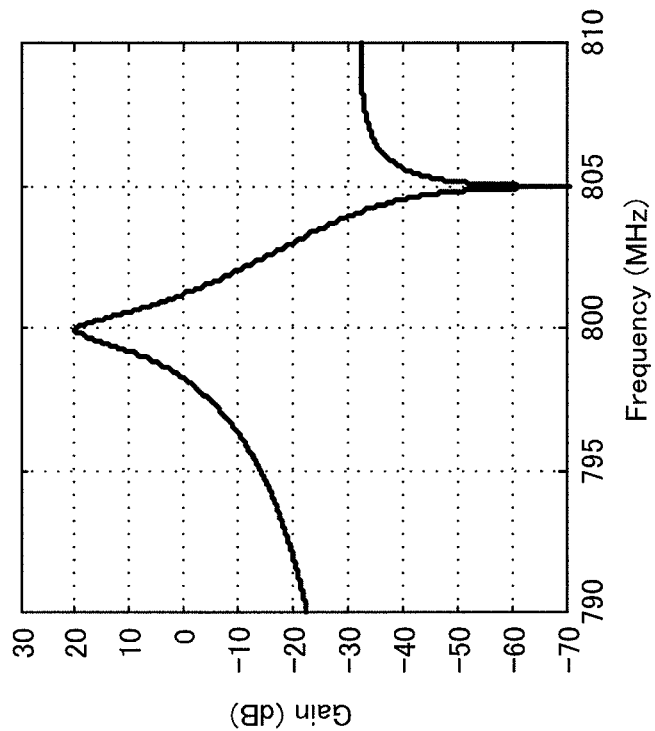
FIG. 11 is an example of frequency response realized with Embodiment 1.
Figure 11A:
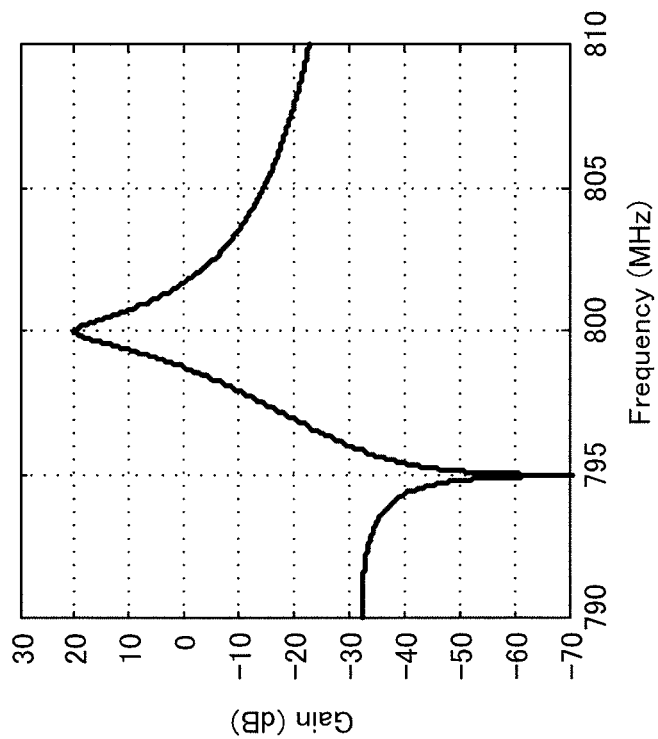

FIG. 11 shows examples of frequency characteristics obtained by using the above-described method (here, $f_{LO}$=800 MHz). FIG. 11A shows an example of a frequency characteristic having an attenuation pole in the left side of the LO frequency, and FIG. 11B shows an example of a frequency characteristic having an attenuation pole in the right side of the LO frequency. It is understood that it is possible to realize asymmetric frequency characteristics by obtaining a complex coefficient transfer function. Moreover, it is understood that greater image rejection ratio can be obtained by generating attenuation poles.

As described above, according to the present embodiment, IQ generating circuit 101 samples signals having phases 90 degrees shifted rom each other, each discrete time circuit 102-$k$ performs weighting, and, finally, output adding circuit 103 outputs the adding result, so that it is possible to realize a frequency characteristic having an attenuation pole in one side and produce excellent image rejection characteristics. By this means, even if there is a large image signal, it is possible to realize a LOW-IF receiver.

In addition, although with the present embodiment, the configuration as an assumption has been explained where digital control unit 104 generates and supplies local frequency signals LO to sampling switches 1012 to 1015, the present invention is not limited to this. For example, another configuration is possible where local frequency signals LO to supply to sampling switch 1012 are generated apart from digital control unit 104 and supplied.

In addition, although with the present embodiment, the configuration has been explained where main rotate capacitor 10213 in each of rotate capacitor units 1021-1 to 1021-4 is grounded through reset switch 1023 after electrical charge sharing, it is possible to improve gain by holding the electrical charge without grounding. It is possible to reduce the number of switches and control signals and consequently simplify the circuit configuration.

Embodiment 2

Figure 12:
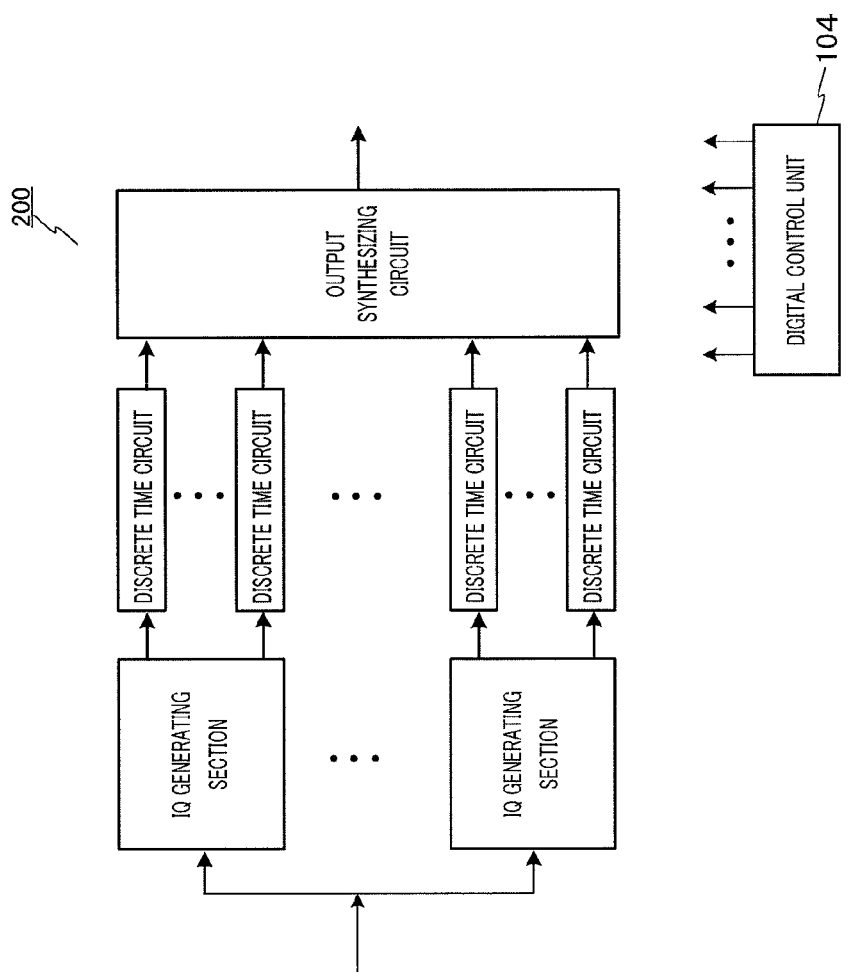
FIG. 12 is a block diagram showing a configuration of a sampling circuit according to Embodiment 2 of the present invention.

FIG. 12 shows the configuration of sampling circuit 200 according to the present embodiment. Embodiment 2 differs from Embodiment 1 in that a plurality of IQ generating circuits are provided in parallel, a plurality of discrete time circuits are connected to each IQ generating circuit in parallel, and a adding circuit adds outputs from all the discrete time circuits.

According to this configuration, it is possible to control the position of each of bilateral asymmetric attenuation poles and also possible to support a system having strong interfering waves in bilateral asymmetric positions centered around a local signal frequency.

Figure 13:
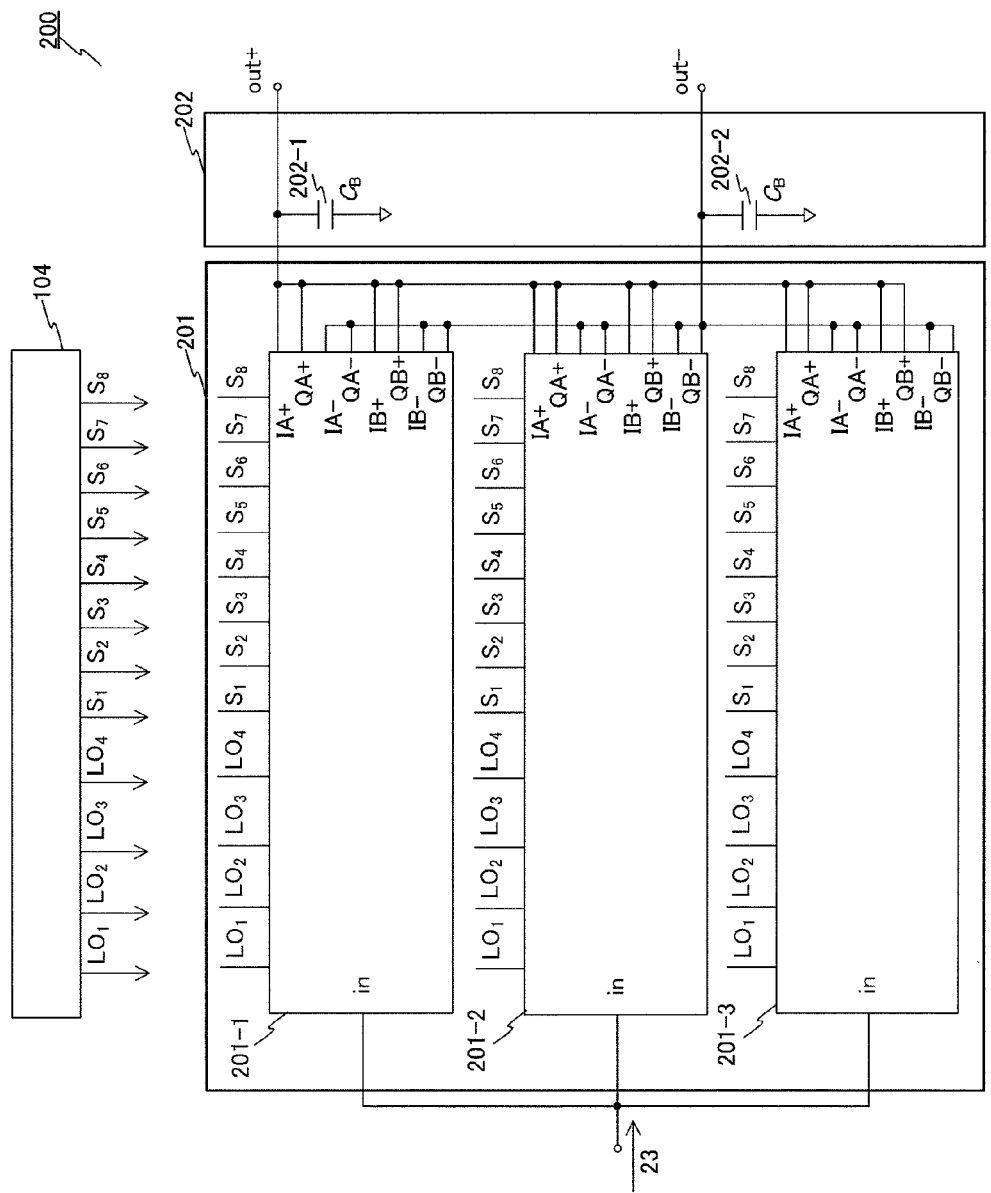
FIG. 13 is a connection diagram showing the configuration of the sampling circuit according to Embodiment 2.

FIG. 13 shows a specific example of sampling circuit 200. First, the configuration of sampling circuit 200 will be explained, and next, the operation will be explained.

Sampling circuit 200 has complex electrical charge sharing circuit 201 composed of complex discrete time circuits 201-1 to 201-3, output adding circuit 202 composed of buffer capacitors 202-1 to 202-2, and digital control unit 104.

Although with embodiment 1, output is determined by connecting to one buffer capacitor 1031, buffer capacitor 202-1 outputs a signal having the positive phase and buffer capacitor 202-2 outputs a signal having the negative phase at the same time as differential output, with the present embodiment.

Figure 14:
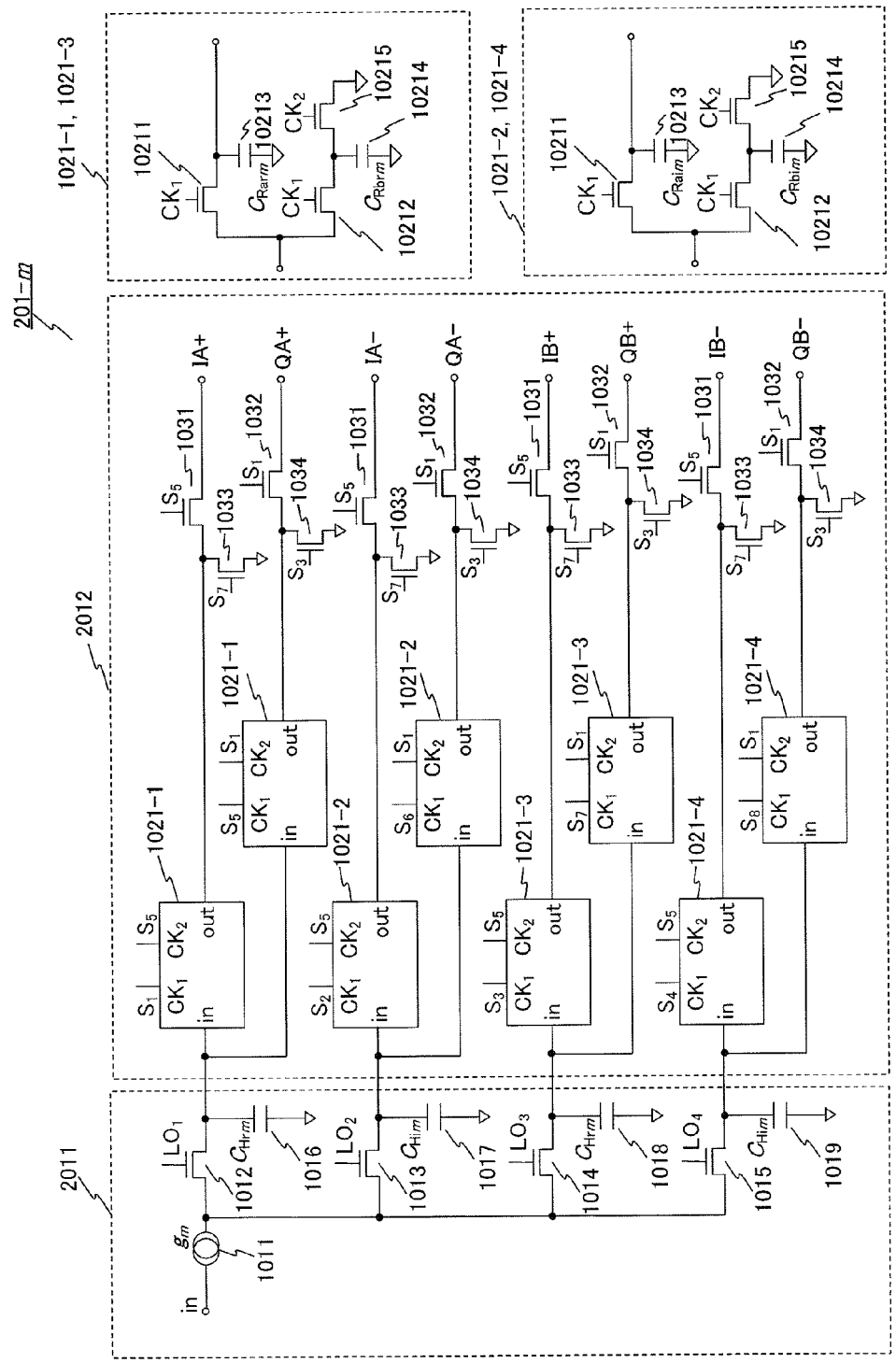
FIG. 14 is a connection diagram showing a configuration of a complex discrete-time circuit according to Embodiment 2.
Figure 15B:
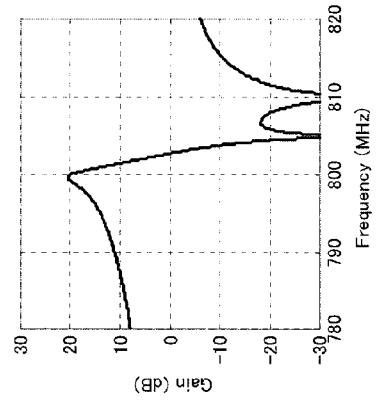
FIG. 15 is an example of frequency response realized with Embodiment 2.
Figure 15D:
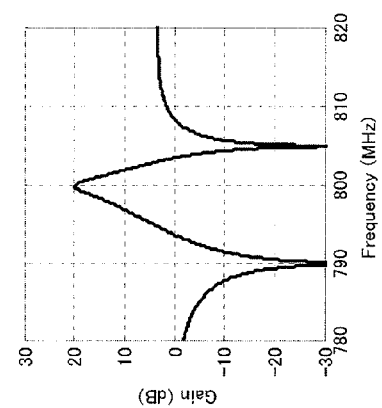
Figure 15A:
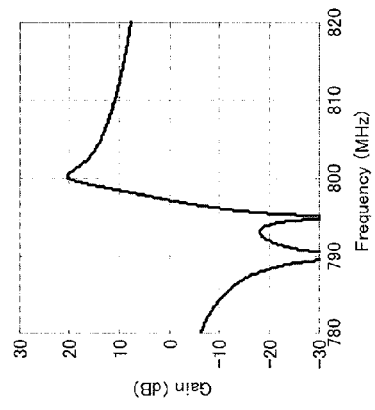
Figure 15C:
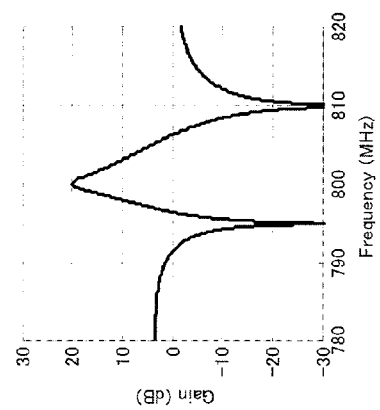
Figure 16C:
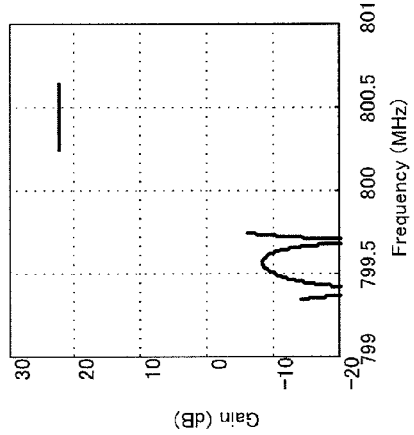
FIG. 16 is a frequency responses of the conventional configuration, Embodiment 1 and Embodiment 2.
Figure 16B:
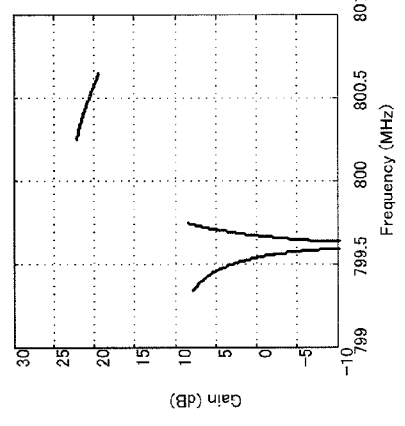
Figure 16A:
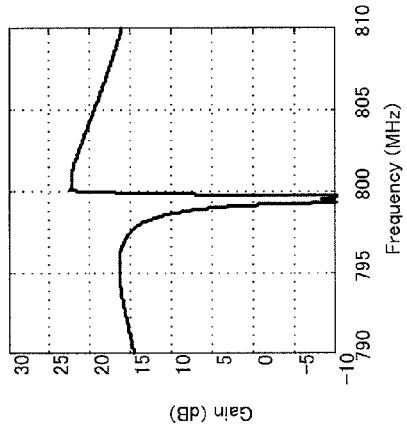
Figure 16A:
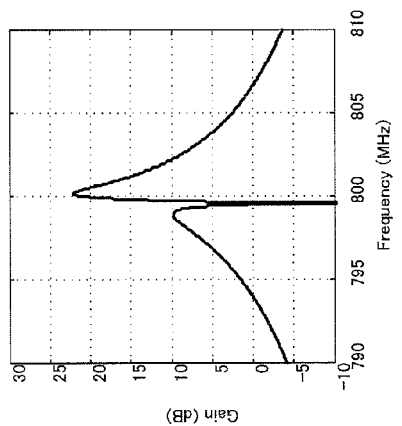
Figure 16A:
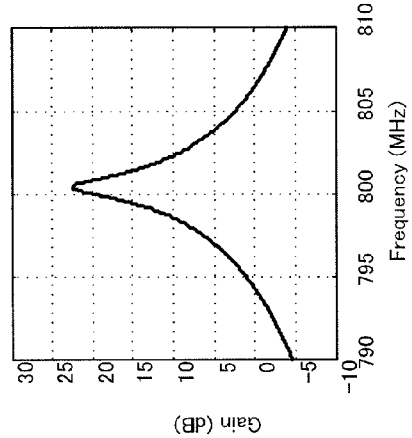

FIG. 14 shows the configuration of complex discrete time circuit 201-$m$. Complex discrete time circuit 201-$m$ has IQ generating circuit 2011 and discrete time circuit 2012. The configuration of IQ generating circuit 2011 is the same as that of IQ generating circuit 101. The configuration of discrete time circuit 2012 is the same as that of electrical charge sharing circuit 102 shown in embodiment 1. That is, the components constituting complex discrete time circuit 201-$m$ correspond to IQ generating circuit 101 and electrical charge sharing circuit 102, respectively. Here, in discrete time circuit 2012, rotate capacitor units 1021-1 and 1021-3 have the same value, and rotate capacitor units 1021-2 and 1021-4 have the same value, and respective same values correspond to the real part and imaginary part in a complex number. Control signals outputted from digital control unit 104 are shown in FIG. 9, like in Embodiment 1.

Next, operation of sampling circuit 200 according to the present embodiment will be explained.

The components constituting each of complex discrete time circuits 210-1 to 201-3 correspond to IQ generating circuit 101 and electrical charge sharing circuit 102, and perform like IQ generating circuit 101 and the electrical charge sharing circuit 102, respectively.

Here, the present embodiment differs from Embodiment 1 in that how to connect outputs to buffer capacitors. In FIG. 13, the outputs corresponding to I+ and Q+ of each of complex discrete time circuits 201-1 to 201-3 are connected to buffer capacitor 202-1, the outputs corresponding to I- and Q- of each of complex discrete time circuits 201-1 to 201-3 are connected to buffer capacitor 202-2, and electrical charge are shared between each corresponding discrete time circuit 201 and buffer capacitor 202 at the same timing $LO_1$ to determine the output voltage. In addition, it is necessary to realize negative coefficients to obtain frequency characteristics having attenuation poles. The sign of each 1st order of IIR is determined by selecting the connection between outputs of discrete time circuit 201 and buffer capacitor 202.

It is possible to describe the entire transfer function as the following equation.

(Equation 5)

$$T = T_{IIR} \cdot \frac{\sum_{m=1}^{3}(C_{Rarm} + C_{Raim})}{\sum_{m=1}^{3}(C_{Rarm} + C_{Raim}) + C_B(1 - z^{-1})} \quad [4]$$

(Equation 6)

$$T_{IIR} = \frac{g_m T_{LO}}{\pi\sqrt{2}\sum_{m=1}^{n}(C_{Rarm}+C_{Raim})} \cdot \sum_{m=1}^{3}\left(\frac{C_{Rarm}}{C_{Rarm}+C_{Rbrm}+C_{Hrm}(1-z^{-1})} + \frac{jC_{Raim}}{C_{Raim}+C_{Rbim}+C_{Him}(1-z^{-1})}\right)$$

Here, in equation 5 and equation 6, $T_{LO}$ is the sampling period determined based on local signals LO inputted to sampling switches 1012 to 1015, and $g_m$ is the transconductance value of TA (transconductance amplifier) 1011. $C_{Hrm}$ is the capacitance value of history capacitor 1016 and 1018, and $C_{Him}$ is the capacitance value of history capacitor 1017 and 1019. $C_{Rarm}$ is the capacitance value of main rotate capacitor 10213 in each of rotate capacitor units 1021-1 and 1021-3 in complex discrete time circuit 201-*m*. In addition, $C_{Rbrm}$ is the capacitance value of sub-rotate capacitor 10214 in each of rotate capacitor units 1021-1 and 1021-3 in complex discrete time circuit 201-*m*. Moreover, $C_{Raim}$ is the capacitance value of main rotate capacitor 10213 in each of rotate capacitor units 1021-2 and 1021-4 in complex discrete time circuit 201-*m*. Furthermore, $C_{Rbim}$ is the capacitance value of sub-rotate capacitor 10214 in each of rotate capacitor units 1021-2 and 1021-4 in complex discrete time circuit 201-*m*.

Here, note that in the transfer functions represented by equations 5 and 6, it is not possible to produce desired filter frequency response characteristics by simply setting circuit element values at random.

Next, an example of a method of determining circuit element values in equation 5 and equation 6 will be shown. First, coefficient values of the prototype of the transfer function shown in equation 7 will be considered.

(Equation 7)

$$T_{proto} = \sum_{m=1}^{3}\left(\frac{a_m}{b_m+1-z^{-1}}\right) \quad [5]$$

Here, it is important that any complex number can be selected as $a_m$. $b_m$ is any positive real number corresponding to the cutoff frequency of a first-order IIR filter. It is possible to derive coefficient values of the transfer function having attenuation poles at any frequencies $f_{N1}$ and $f_{N2}$, from the following equation.

(Equation 8)

$$\begin{bmatrix} a_1 \\ a_2 \\ a_3 \end{bmatrix} = \begin{bmatrix} \frac{(b_2+1-z_{N1}^{-M})(b_3+1-z_{N1}^{-M})}{1-z_{N1}^{-M}} & \frac{(b_1+1-z_{N1}^{-M})(b_3+1-z_{N1}^{-M})}{1-z_{N1}^{-M}} & \frac{(b_2+1-z_{N1}^{-M})(b_1+1-z_{N1}^{-M})}{1-z_{N1}^{-M}} \\ \frac{(b_2+1-z_{N2}^{-M})(b_3+1-z_{N2}^{-M})}{1-z_{N2}^{-M}} & \frac{(b_2+1-z_{N2}^{-M})(b_3+1-z_{N2}^{-M})}{1-z_{N2}^{-M}} & \frac{(b_2+1-z_{N2}^{-M})(b_3+1-z_{N2}^{-M})}{1-z_{N2}^{-M}} \\ 1/b_1 & 1/b_2 & 1/b_3 \end{bmatrix}^{-1} \begin{bmatrix} 0 \\ 0 \\ A \end{bmatrix} \quad [6]$$

Here, $z_{N1}=\exp(j2\pi f_{N1}T_{LO})$ and $z_{N2}=\exp(j2\pi f_{N2}T_{LO})$ are arbitrary complex numbers. Here, for example, assume that $b_2=lb_1$, $b_3=mb_2$ and A, l, m and $b_1$ are any positive real numbers, it is possible to calculate $a_1$, $a_2$ and $a_3$.

By comparing equation 7 having coefficients determined by equation 8 with equation 6, circuit element values are determined.

FIG. 15 shows examples of frequency characteristics obtained using the above-described method (here, $f_{LO}$=800 MH). FIG. 15A shows an example of a frequency characteristic having two attenuation poles in the left side of the LO frequency. In addition, FIG. 15B shows an example of a frequency characteristic having two attenuation poles in the right side of the LO frequency. Each of FIG. 15C and FIG. 15D shows a frequency characteristic having attenuation poles in the bilaterally asymmetric positions centered around the LO frequency. It is understood that it is possible to realize bilateral asymmetric frequency characteristics by obtaining a transfer function with complex numbers.

FIG. 16 is characteristic diagram in a case in which the prior art, Embodiment 1 and Embodiment 2 are applied to an ISDB-T one segment receiver. FIG. 16A shows a case of the prior art, FIG. 16B shows a case of Embodiment 1 and FIG. 16C shows a case of Embodiment 2. Each upper drawing shows an example of a frequency characteristic, and each lower drawing is an enlarged view showing the desired band (from 250 kHz to 650 kHz) and an image band (from −650 kHz to −250 kHz). Although with the prior art, it is possible to obtain only the amount of attenuation of 7 dB, it is possible to obtain the amount of image rejection of 18.1 dB with Embodiment 1, and, it is possible to obtain a greater amount of image rejection of 35.1 dB. It is understood that it is possible to achieve a greater image rejection ratio by generating attenuation poles.

As described above, according to the present embodiment, IQ generating circuit 2011 samples signals having phases 90 degrees shifted from each other, each discrete time circuit 2012 performs weighting, and, finally, the output adding circuit (buffer capacitors 202-1 and 202-2) outputs the adding result, so that it is possible to realize a frequency characteristic having an attenuation pole in one side and therefore to produce excellent image rejection characteristics. Moreover, it is possible to realize the number of attenuation poles corresponding to the number of complex discrete time circuits in parallel, so that, even if there are significant interfering signals, it is possible to realize a receiver by freely setting attenuation poles in appropriate positions, including bilateral symmetric positions and bilateral asymmetric positions.

Here, although a case has been explained where the number of complex discrete time circuits 201-1 to 202-*n* in parallel is 3, it is possible to realize circuit design using any number n complex discrete time circuits in parallel. In this case, it is possible to obtain n−1 attenuation poles with n parallel case.

Embodiment 3

Figure 1:
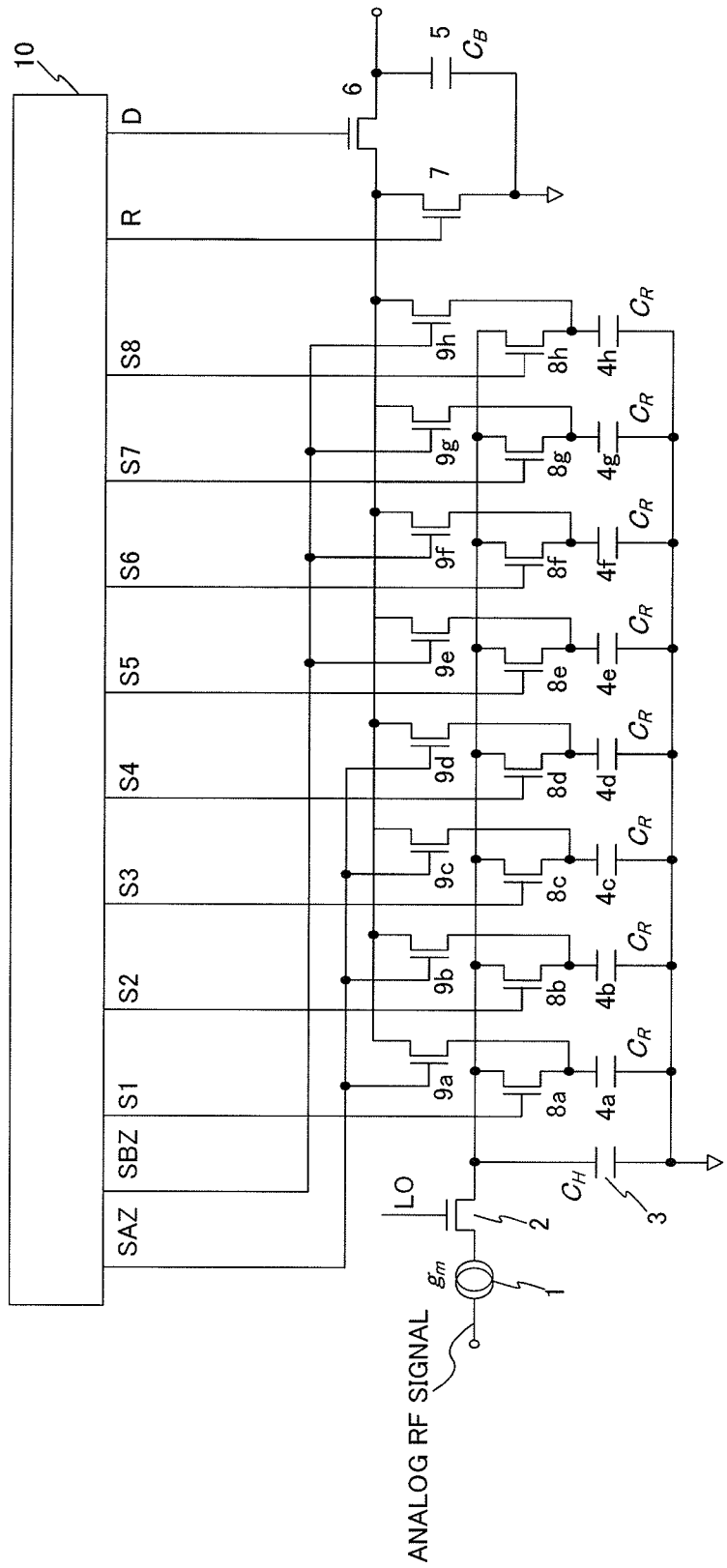
FIG. 1 shows an example of a configuration of a conventional sampling circuit.
Figure 2:
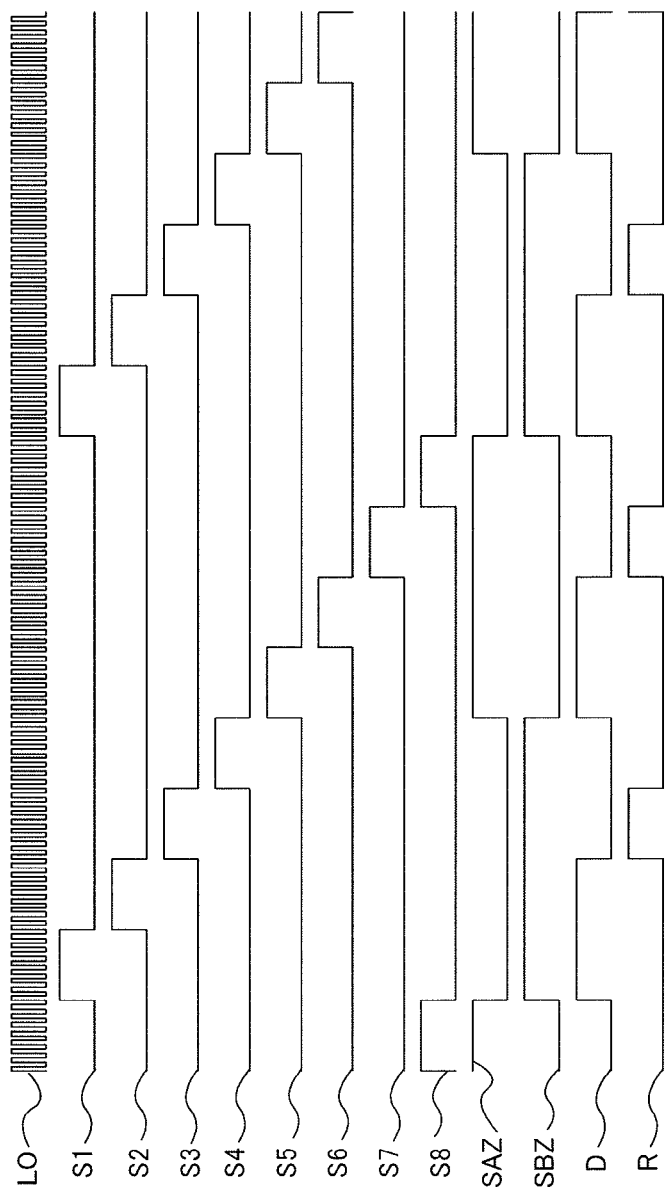
FIG. 2 is a timing chart explaining control signals in the conventional sampling circuit.
Figures 3A, 3B:
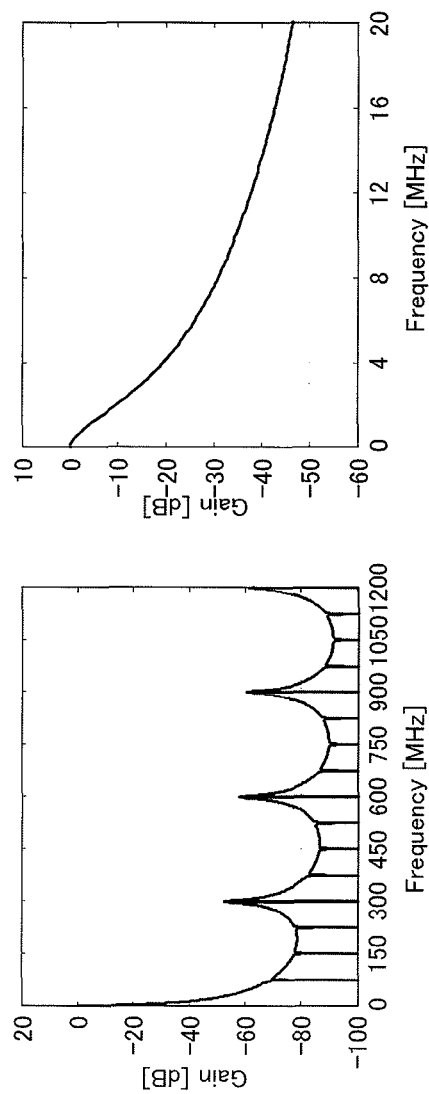
FIG. 3 is an example of frequency response realized by the conventional sampling circuit.
Figure 4:
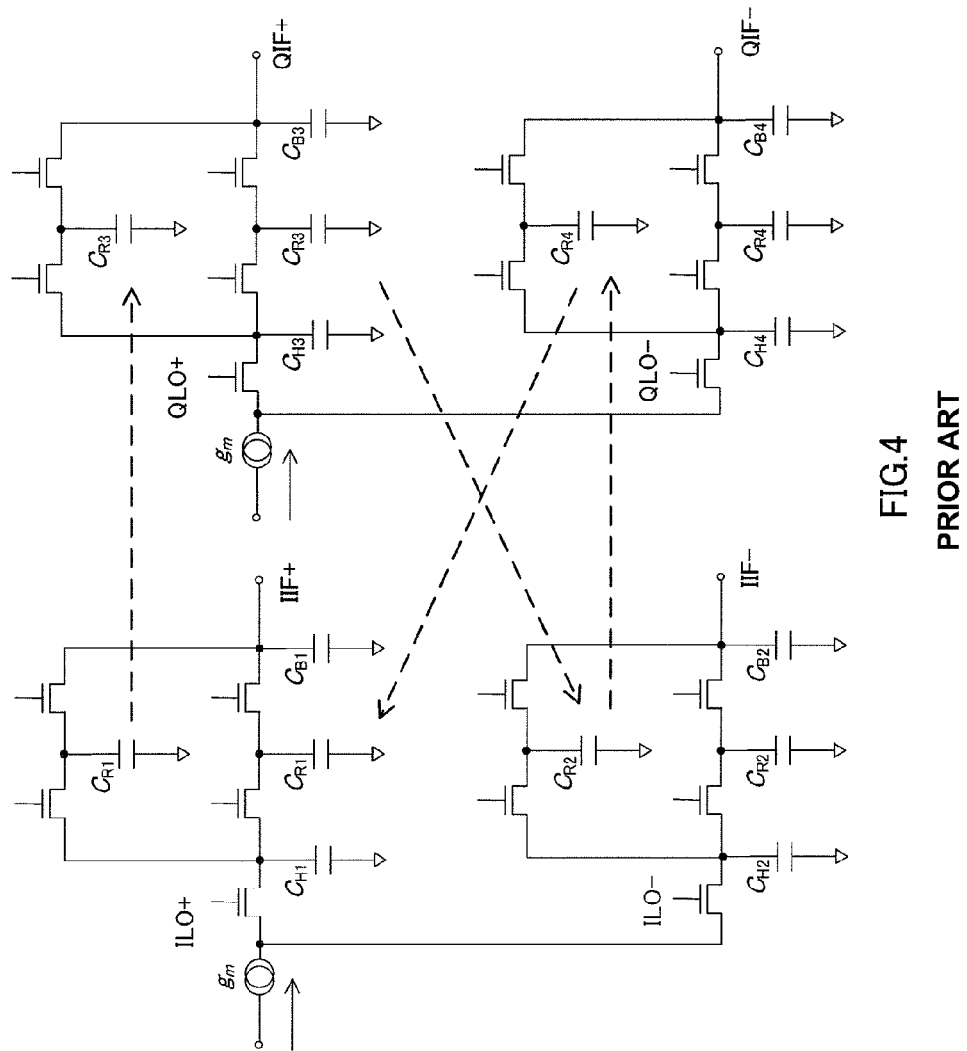
FIG. 4 shows an example of a configuration of the conventional sampling circuit.
Figure 5:
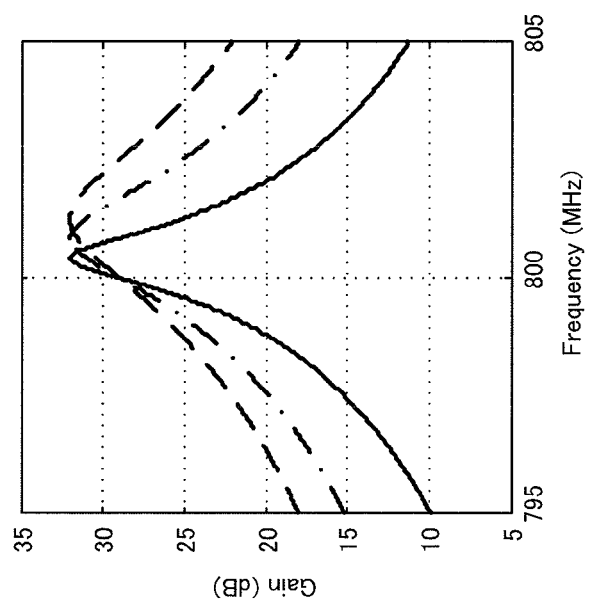
FIG. 5 is an example of frequency response realized by the conventional sampling circuit.
Figure 17:
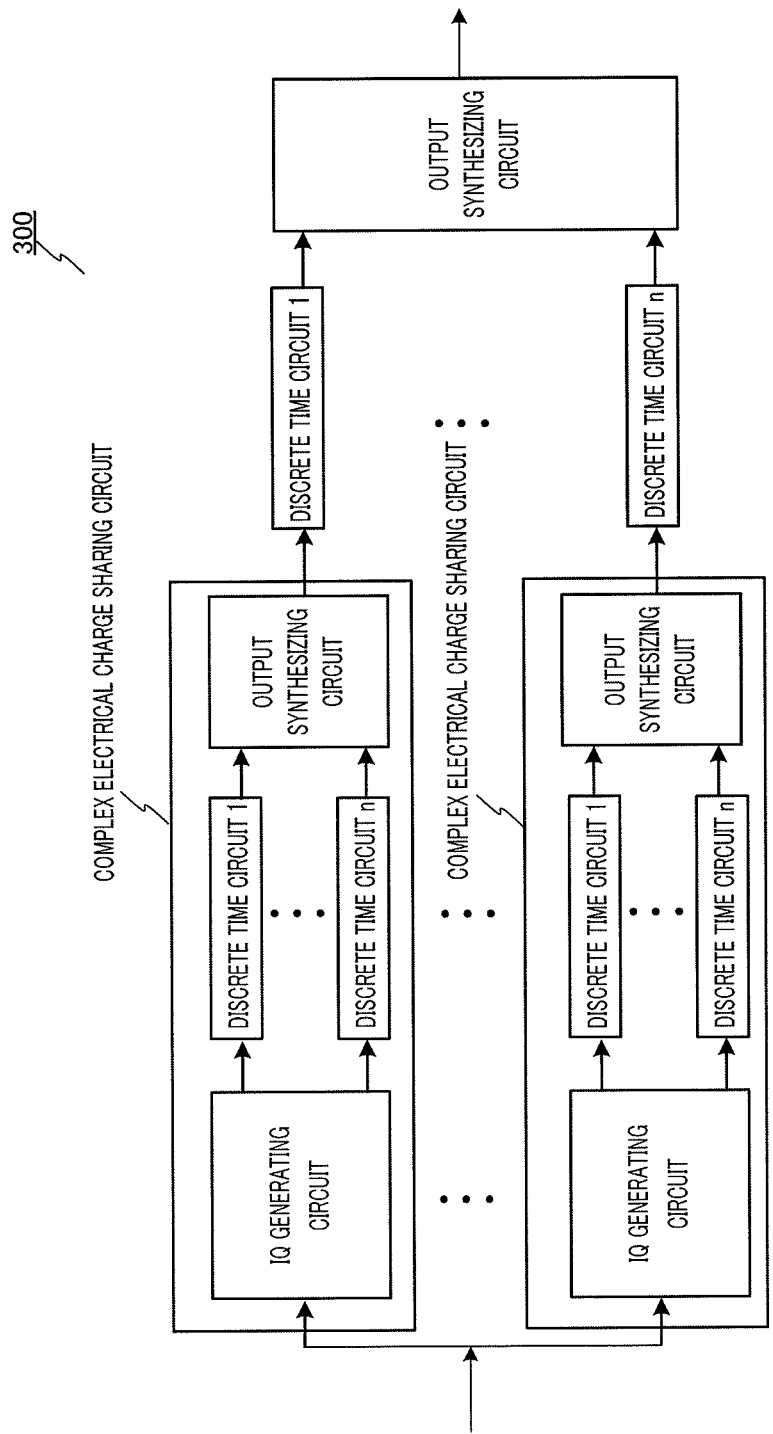
FIG. 17 is a block diagram showing a configuration of a combined sampling circuit according to Embodiment 3 of the present invention.

FIG. 17 shows the configuration of combined sampling circuit 300 according to the present embodiment. Combined sampling circuit 300 is applicable as sampling circuit 13 shown in FIG. 1. Combined sampling circuit 300 according to the present embodiment has a configuration in which signals from outputted from the sampling circuit according to Embodiment 1 are inputted to additional discrete time circuits (complex electrical charge sharing circuits in the second stage), and finally, are added in a adder (output adding circuit). That is, the sampling circuit according to Embodiment 1 is formed as complex electrical charge sharing circuits in the first stage, and the discrete time circuits and the adder (output adding circuit) connected to the first stage of complex electrical charge sharing circuits in cascade arrangement constitute the second complex electrical charge sharing circuit in the second stage. That is, combined sampling circuit 300 according to the present embodiment has a configuration in which circuit elements of the sampling circuit according to Embodiment 1 are connected in cascade arrangement. By this configuration, it is possible to generate attenuation poles in both sides of the LO frequency without cancelling the gain between each branch.

Figure 18C:
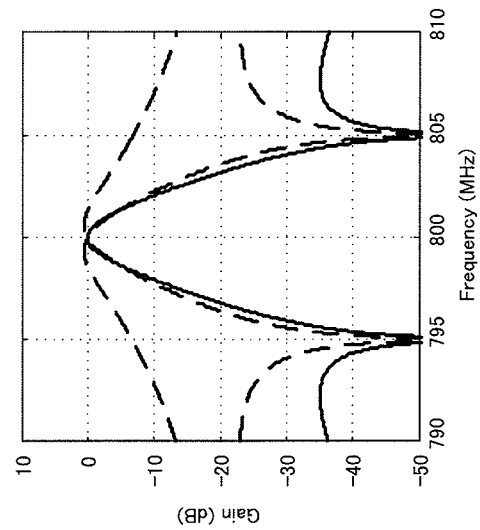
FIG. 18 is a characteristic diagram showing examples of filter characteristics realized with Embodiment 3.
Figure 18B:
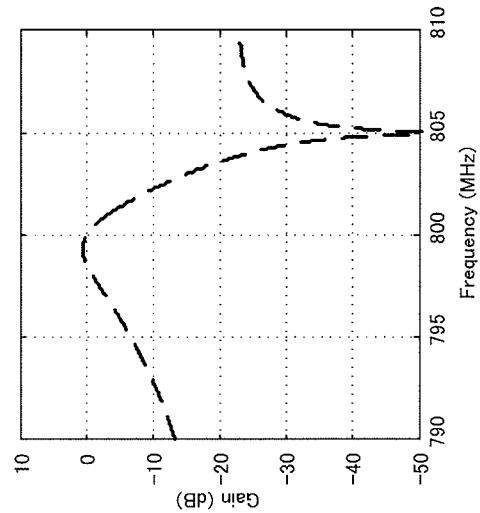
Figure 18A:
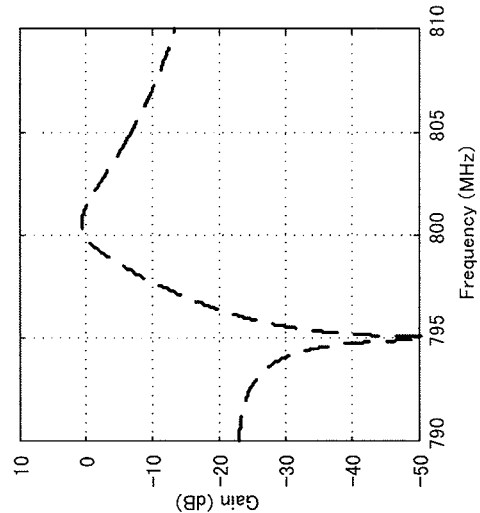

FIG. 18 shows an effect of connecting circuit elements in Embodiment 1 in cascade arrangement (an example of a frequency characteristic, here $f_{LO}$=800 MHz). FIG. 18A shows an example of an attenuation pole generated in the left side of the LO frequency, and FIG. 18B shows an example of an attenuation pole generated in the right side of the LO frequency. FIG. 18C shows the product of the characteristic shown in FIG. 18A and the characteristic shown in FIG. 18B. That is, it is possible to generate bilateral symmetric attenuation poles centered around the LO frequency by connecting each configuration in which an attenuation pole is generated in one side, in cascade arrangement. As compared to the case of Embodiment 2 where sampling circuit 200 generates attenuation poles in both sides, it is possible to generate attenuation poles while reducing cancellation of the gain between branches. That is, as compared to the configuration in which attenuation poles are generated in both end sides of the LO frequency by increase in the number of discrete time circuits in parallel, it is possible to improve gain.

Figure 19:
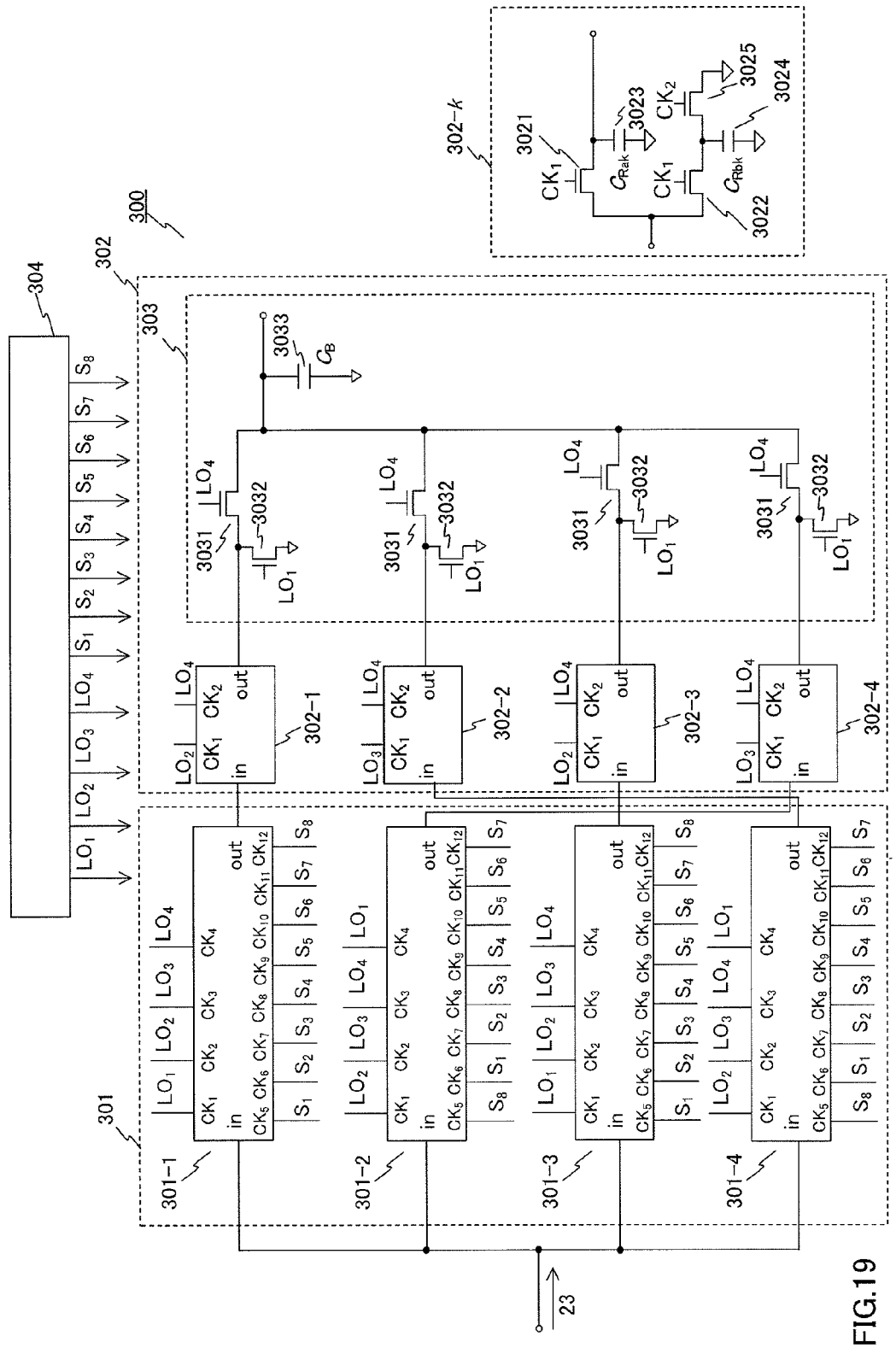
FIG. 19 is a connection diagram showing a configuration of a sampling circuit according to Embodiment 3.

FIG. 19 shows a specific example of combined sampling circuit 300.

Combined sampling circuit 300 has complex electrical charge sharing circuit 301 in the first stage composed of complex discrete time circuits 301-1 to 301-4, rotate capacitor units 302-1 to 302-4, output adding circuit 303 and digital control unit 304. Here, rotate capacitor units 302-1 to 302-4 and output adding circuits 303 constitute complex electrical charge sharing circuit 302 in the second stage.

Each of rotate capacitor units 302-$k$ ($k$=1 to 4) has integration switches 3021 and 3022, main rotate capacitor 3023, sub-rotate capacitor 3024 and release switch 3025.

Output adding circuit 303 has dump switch 3031, reset switch 3032 and buffer capacitor 3033.

Figure 20:
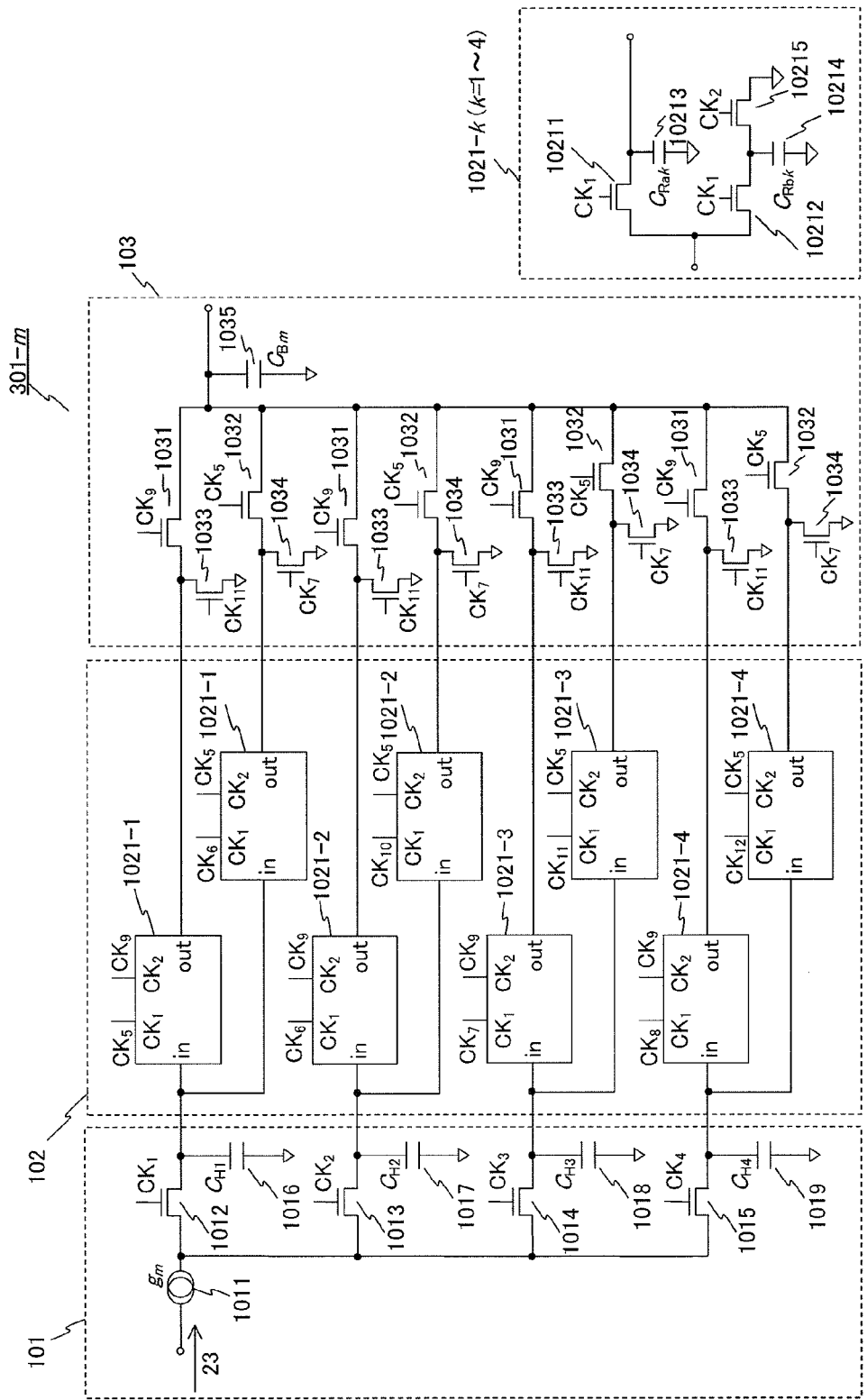
FIG. 20 is a connection diagram showing a configuration of a complex discrete-time circuit according to Embodiment 3.

FIG. 20 shows the configuration of complex discrete time circuit 301-$m$. The configuration of complex discrete time circuit 301-$m$ is the same as that of sampling circuit 100 shown in Embodiment 1. Control signals outputted from digital control unit 304 are shown in FIG. 10 like in Embodiment 1.

Next, operation of combined sampling circuit 300 according to the present embodiment will be explained.

First, complex discrete time circuit 301-$m$ performs the same operation as the operation of sampling circuit 100. Here, the present embodiment differs from Embodiment 1 in the following point.

In order to realize a configuration in which two complex discrete time circuits are connected in cascade arrangement, that is, in order to connect complex electrical charge sharing circuit 302 in the second stage to the output stage of complex electrical charge sharing circuit 301, it is necessary to correspond complex discrete time circuit 301-1 to I+, complex discrete time circuit 301-2 to Q+, and complex discrete time circuit 301-3 to I−, and complex discrete time circuit 301-4 to Q−. Therefore, in the configuration shown in FIG. 19, digital control unit 304 shifts 90 degrees between the clock signals inputted to complex discrete time circuits 301-1 and 301-3 and the clock signals inputted to complex discrete time circuits 301-2 and 301-4.

Moreover, by switching the positive sign and the negative sign between transconductance value $g_m$ of TA (transconductance amplifier) 1011 in each of complex discrete time circuits 301-1 and 301-2 and transconductance value $g_m$ of TA (transconductance amplifier) 1011 in each of complex discrete time circuits 301-3 and 301-4, it is possible to generate each branch I+, Q+, I− and Q− to produce the frequency characteristic having an attenuation pole in one side. It is possible to switch the positive sign and the negative sign between $g_m$s by using a balun and a differential circuit configuration. In addition, although each buffer capacitor 1035 serves as an output section in Embodiment 1, it serves as the history capacitor in the next stage in the present embodiment, and therefore is set to the different value between complex discrete time circuits 301-1 to 301-4.

Next, upon receiving a signal outputted from complex discrete time circuit 301-$m$, as input, complex electrical charge sharing circuit 302 in the second stage composed of rotate capacitor units 302-1 to 302-4 and output adding circuit 303 starts operation.

Complex discrete time circuit 301-2 and rotate capacitor unit 302-4 are connected and complex discrete time circuit 301-4 and rotate capacitor unit 302-2 are connected in order to inverse the coefficients of the numerators of the transfer function between complex electrical charge sharing circuit 301 in the first stage and complex electrical charge sharing circuit 302 in the second stage. By this means, it is possible to make the positions of the attenuation pole in the first stage and the attenuation pole in the second stage bilaterally symmetric centered around the LO frequency.

At the time $LO_2$ enters the high level period, buffer capacitor 1035 in each of complex discrete time circuits 301-1 and 301-3 shares electrical charge with main rotate capacitor 3023 and sub-rotate capacitor 3024 in each of rotate capacitor units 302-1 and 302-3.

Simultaneously, at the time $LO_3$ enters the high level period, buffer capacitor 1035 in each of complex discrete time circuits 301-2 and 301-4 shares electrical charge with main rotate capacitor 3023 and sub-rotate capacitor 3024 in each of rotate capacitor units 302-2 and 302-4. By this means, the input voltage at each branch is determined in the second stage.

At the time $LO_4$ enters the high level period, main rotate capacitor 3023 and buffer capacitor 3033 in each of rotate capacitor units 302-1 to 302-4 shares electrical charge with buffer capacitor 3033, so that the entire output voltage is determined. Simultaneously, sub-rotate capacitor 3024 in each of rotate capacitor units 302-1 to 302-4 is grounded to reset via reset switch 3032.

At the time $LO_1$ enters the high level period, main rotate capacitor 3032 in each of rotate capacitor units 302-1 to 302-4 is grounded to reset via reset switch 3032, and consequently a series of steps finishes.

By repeating the above-described steps, the entire transfer function is determined.

It is possible to describe the entire transfer function as the following equation.

(Equation 9)

$$T = T_{IIR1} \cdot T_{IIR2} \cdot \frac{\sum_{k=1}^{4} C_{Rak}}{\sum_{k=1}^{4} C_{Rak} + C_B(1 - z^{-1})} \quad [7]$$

(Equation 10)

$$T_{IIR1} = \frac{g_m T_{LO}}{\pi\sqrt{2} \sum_{k=1}^{4} C_{Rak}} \cdot$$

$$\left( \frac{C_{Ra1}}{C_{Ra1} + C_{Rb1} + C_{H1}(1 - z^{-1})} + \frac{jC_{Ra2}}{C_{Ra2} + C_{Rb2} + C_{H2}(1 - z^{-1})} \right)$$

(Equation 11)

$$T_{IIR2} = \frac{C_{Ra1}^2/(C_{Ra1} + C_{Rb1})}{C_{Ra1} + C_{Rb1} + C_{B1}(1 - C_{B1}/(C_{Ra1} + C_{Rb1})z^{-1})} +$$

$$\frac{jC_{Ra2}^2/(C_{Ra4} + C_{Rb4})}{C_{Ra2} + C_{Rb2} + C_{B2}(1 - C_{B2}/(C_{Ra4} + C_{Rb4})z^{-1})} +$$

$$\frac{C_{Ra3}^2/(C_{Ra3} + C_{Rb3})}{C_{Ra3} + C_{Rb3} + C_{B3}(1 - C_{B3}/(C_{Ra3} + C_{Rb3})z^{-1})} +$$

$$\frac{jC_{Ra4}^2/(C_{Ra2} + C_{Rb2})}{C_{Ra4} + C_{Rb4} + C_{B4}(1 - C_{B4}/(C_{Ra2} + C_{Rb2})z^{-1})}$$

Here, in equation 9 to equation 11, $T_{LO}$ is the sampling period determined based on local signals LO inputted to sampling switches 1012 to 1015, and $g_m$ is the transconductance value of TA (transconductance amplifier) 1011. In addition, $C_{H1}$ to $C_{H4}$ are respective capacitance values of history capacitors 1016 to 1019. Moreover, $C_{Rak}$ is the capacitance value of main rotate capacitor 10213 in rotate capacitor unit 1021-$k$, and $C_{Rbk}$ is the capacitance value of sub-rotate capacitor 10214 in rotate capacitor unit 1021-$k$.

Here, note that if circuit element values are simply set at random in the transfer functions represented by equations 9 to 11, it is not possible to obtain desired filter response characteristics.

Next, an example of a method of determining the circuit element values in equations 9 to 11 will be shown. First, coefficient values in the prototype of the transfer function shown in equation 12.

(Equation 12)

$$T_{proto} = \sum_{m=1}^{2} \left( \frac{a_m}{b_m + 1 - z^{-1}} \right) \cdot \sum_{m=1}^{2} \left( \frac{a_m^*}{b_m + 1 - z^{-1}} \right) \quad [8]$$

It is important that it is possible to select any complex number as $a_m$. $a_m^*$ represents the conjugate of $a_m$. $b_k$ is any positive real number corresponding to the cutoff frequency of a first-order IIR filter. It is possible to derive coefficient values of a transfer function having attenuation poles at any frequency $f_N$ from the following equation.

(Equation 13)

$$\begin{bmatrix} a_1 \\ a_2 \end{bmatrix} = \begin{bmatrix} b_2 + 1 - z_N^{-M} & b_1 + 1 - z_N^{-M} \\ 1/b_1 & 1/b_2 \end{bmatrix} \begin{bmatrix} 0 \\ A \end{bmatrix} \quad [9]$$

Here, $z_N = \exp(j2\pi f_N T_{LO})$ is any positive real number. Here, assume that $b_2 = lb_1$ and A, 1 and $b_1$ are any positive real numbers, it is possible to calculate $a_1$ and $a_2$.

By comparing Equation 12 having the coefficients determined by equation 13 with equation 10, circuit element values will be determined.

In addition, as seen from equation 11 and equation 12, it is not possible to match between the prototype and the transfer function of the circuit with the circuit configuration shown in FIG. 19, so that it is necessary to adjust element values in order to generate symmetric attenuation poles in both sides.

As described above, according to the present embodiment, it is possible to obtain the frequency characteristic resulting from integrating frequency characteristics each having an attenuation pole in one side as shown in Embodiment 1, and it is possible to generate attenuation poles centered around the passband while preventing gain reduction.

Here, although a case has been explained where complex discrete time circuit 301-$m$ is used as complex electrical charge sharing circuit 301 in the first stage in which complex coefficients are realized in the numerators of the transfer functions as shown in equations 9 to 11, the present invention is not limited to this. As complex electrical charge sharing circuit 301 in the first stage, a complex discrete time circuit may be used in which complex coefficients are realized in the denominators of a transfer function, or the numerators and denominators of a transfer function. Likewise, as complex electrical charge sharing circuit 302 in the second stage, a complex discrete time circuit may be used in which complex coefficients are realized in the numerators of a transfer function or the numerators and denominators of a transfer function.

Embodiment 4

Figure 21:
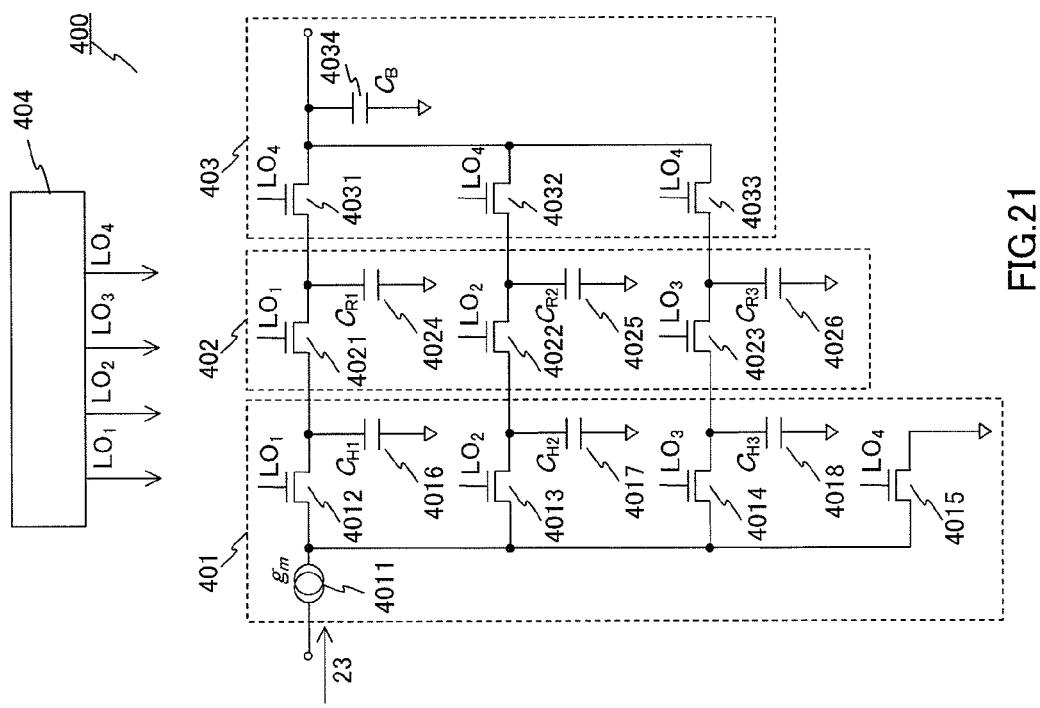
FIG. 21 is a connection diagram showing a configuration of a sampling circuit according to Embodiment 4 of the present invention.

FIG. 21 shows the configuration of sampling circuit 400 according to the present embodiment. The filter characteristic having an attenuation pole in one side described in embodiment 1 is realized with a simpler configuration.

Sampling circuit 400 has IQ generating circuit 401, discrete time circuit 402, output adding circuit 403 and digital control unit 404.

IQ generating circuit 401 has TA (transconductance amplifier) 4011, sampling switches 4012 to 4015 and history capacitors 4016 to 4018. Discrete time circuit 402 has integration switches 4021 to 4023, and rotate capacitors 4024 to 4026.

Here, the capacitance value of history capacitors 4016 to 4018 and the capacitance value of rotate capacitors 4024 to 4026 are set to provide desired characteristics, respectively.

Output adding circuit 403 has dump switches 4031 to 4033, and buffer capacitor 4034. Digital control unit 404 supplies $LO_1$ to $LO_4$ shown in FIG. 9, to sampling circuit 400.

Next, operation of sampling circuit 400 according to the present embodiment will be explained. First, TA (transconductance amplifier) 4011 converts inputted analog RF signal 23 to an analog RF current signal. Sampling switches 4012 to 4015 sample the analog RF current signal using four-phase local frequency signals which are high at times shifted from each other and have a high level period ¼ of an analog RF current signal period.

Now, it will be described that IIR filtering is performed at the same time of this sampling operation, including explanation of discrete time circuit 402.

First, at the time $LO_1$ enters the high level period, history capacitor 4016 and rotate capacitor 4024 integrate electrical charge of a sampling signal. Next, at the time $LO_2$ enters the high level period, history capacitor 4017 and rotate capacitor 4025 integrate electrical charge of a sampling signal. Next, at the time $LO_3$ enters the high level period, history capacitor 4018 and rotate capacitor 4026 integrate electrical charge of a sampling signal to form a discrete time signal. At this time, history capacitors 4016 to 4018 hold the electrical charge one LO period before, and therefore perform IIR filtering operation.

Finally, at the time $LO_4$ enters the high level period, rotate capacitors 4024 to 4026, and buffer capacitor 4034 share electrical charge to determine the output voltage. At this time, buffer capacitor 4034 holds the electrical charge one LO period before, and therefore performs IIR filtering operation. Meanwhile, TA (transconductance amplifier) 4011 grounds via sampling switch 4015 and discharges inputted signals and the electrical charge in TA parasitic capacitance, and therefore secures a period of time to read output signals.

The entire transfer function is represented by the following equation. Here, although the actual transfer function is complicated because there is no timing to discharge the electrical charge from the rotate capacitors, a summary will be presented here.

(Equation 14)

$$T = T_{IIR} \cdot \frac{\sum_{m=1}^{3} C_{Rm}}{\sum_{m=1}^{3} C_{Rm} + C_B(1 - z^{-1})} \quad [10]$$

(Equation 15)

$$T_{IIR} = \frac{g_m T_{LO}}{\pi\sqrt{2} \sum_{m=1}^{n} C_{Rm}} \cdot \left( \frac{C_{R1}}{C_{R1} + C_{H1}(1 - z^{-1})} + \frac{jC_{R2}}{C_{R2} + C_{H2}(1 - z^{-1})} - \frac{C_{R3}}{C_{R3} + C_{H3}(1 - z^{-1})} \right)$$

By comparing the coefficients in the transfer function with coefficients in equation 16, which is the prototype of the transfer function, element values are calculated. The prototype coefficients are calculated using the condition that attenuation poles are generated at specific frequencies as before. Here, it is not possible to match between the prototype and the characteristic, with the transfer function represented by equation 15, so that it is necessary to make an adjustment in order to obtain desired characteristics.

(Equation 16)

$$T_{proto} = \frac{a_1}{b_1 + 1 - z^{-1}} + \frac{ja_2}{b_2 + 1 - z^{-1}} - \frac{a_3}{b_3 + 1 - z^{-1}} \quad [11]$$

As described above, according to the present embodiment, it is possible to realize the frequency characteristic having an attenuation pole in one side as shown in Embodiment 1 with the circuit configuration using only $LO_1$ to $LO_4$ clock signals, and provide excellent image rejection characteristics.

Embodiment 5

With the present embodiment, a technique for reducing the circuit scale of an LOW-IF receiver by applying a combined sampling circuit having been described in Embodiments 1 to 4, will be described. FIG. 22 shows the circuit configuration of a receiver according to the present embodiment.

Figure 22A:
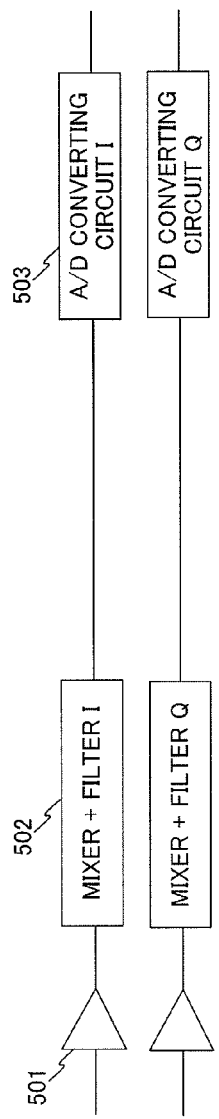
FIG. 22 shows a configuration of a receiver according to Embodiment 5 of the present invention.
Figure 22B:
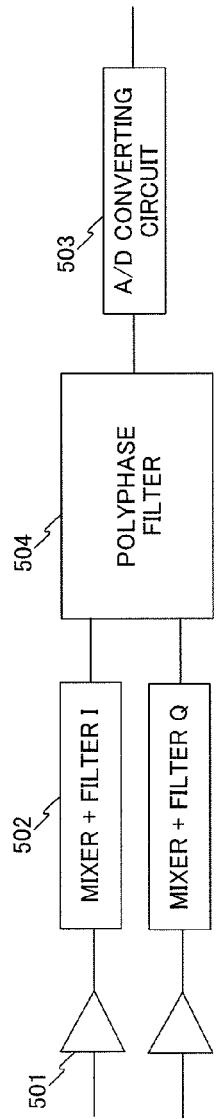
Figure 22C:
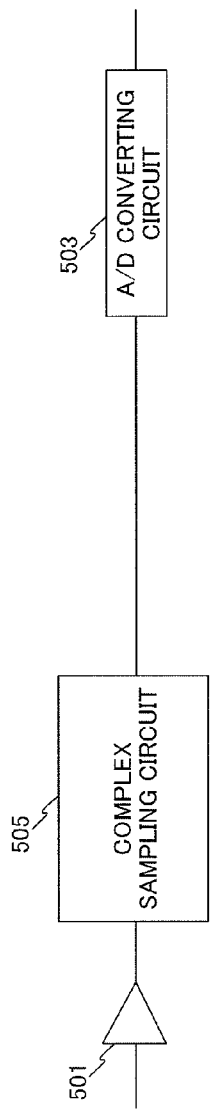

FIG. 22A is a block diagram showing a configuration in which image rejection is performed by digital processing. With this configuration, one amplifier 501, one mixer filter 502 and one A/D converting circuit 503 are required for each of I and Q, so that the circuit scale will increase. Therefore, FIG. 22B shows another configuration of the receiver without A/D converting circuit 503 in FIG. 22A. With this configuration, image rejection is performed by analog polyphase filter 504. Image rejection by digital processing is not performed, so that only one A/D converting circuit 503 is required, and therefore it is possible to reduce the circuit scale Next, FIG. 22C shows another configuration of the receiver using complex sampling circuit 505 to reduce the circuit scale. By using complex sampling circuit 505, it is possible to realize complex filter processing using signals received from one input. No more than one analog converting is required because image frequency signals are removed from the output of complex sampling circuit 505. That is, as compared to the configuration shown in FIG. 22A, it is possible to remove one amplifier 501 and one A/D converting circuit 503. In addition, as compared to the configuration shown in FIG. 22B, it is possible to remove one amplifier 501, replace two mixer filters 502 with one complex sampling circuit 505, eliminate use of polyphase filter 504 and remove one of A/D converting circuits 503, so that it is possible to reduce the circuit scale.

With a diversity reception configuration, receiver sensitivity is improved by performing maximum ratio combining on signals received by a plurality of antennas, using baseband signal processing. By this means, when diversity reception is performed, a plurality of receiving systems are required. A combined sampling circuit has a configuration in which the circuit scale per system is smaller than in a conventional receiver, so that it is possible to significantly reduce the scale of a circuit configuration for diversity reception. Here, in a diversity reception scheme, a plurality of receivers do not necessarily need to have the same configuration. For example, a configuration is possible where a main system is designed to produce the maximum performance and a plurality of receiving systems including simple combined sampling circuits are provided. By reducing the circuit scale, it is possible to produce a large effect of reducing not only the area but also power consumption Embodiment 6

With the present embodiment, further another specific configuration of the sampling circuit according to Embodiment 1. By using the sampling circuit according to the present embodiment, with the configuration of Embodiment 1, it is possible to realize a transfer function in which any number of complex coefficients are arranged in parallel as shown in Embodiment 2.

Figure 23:
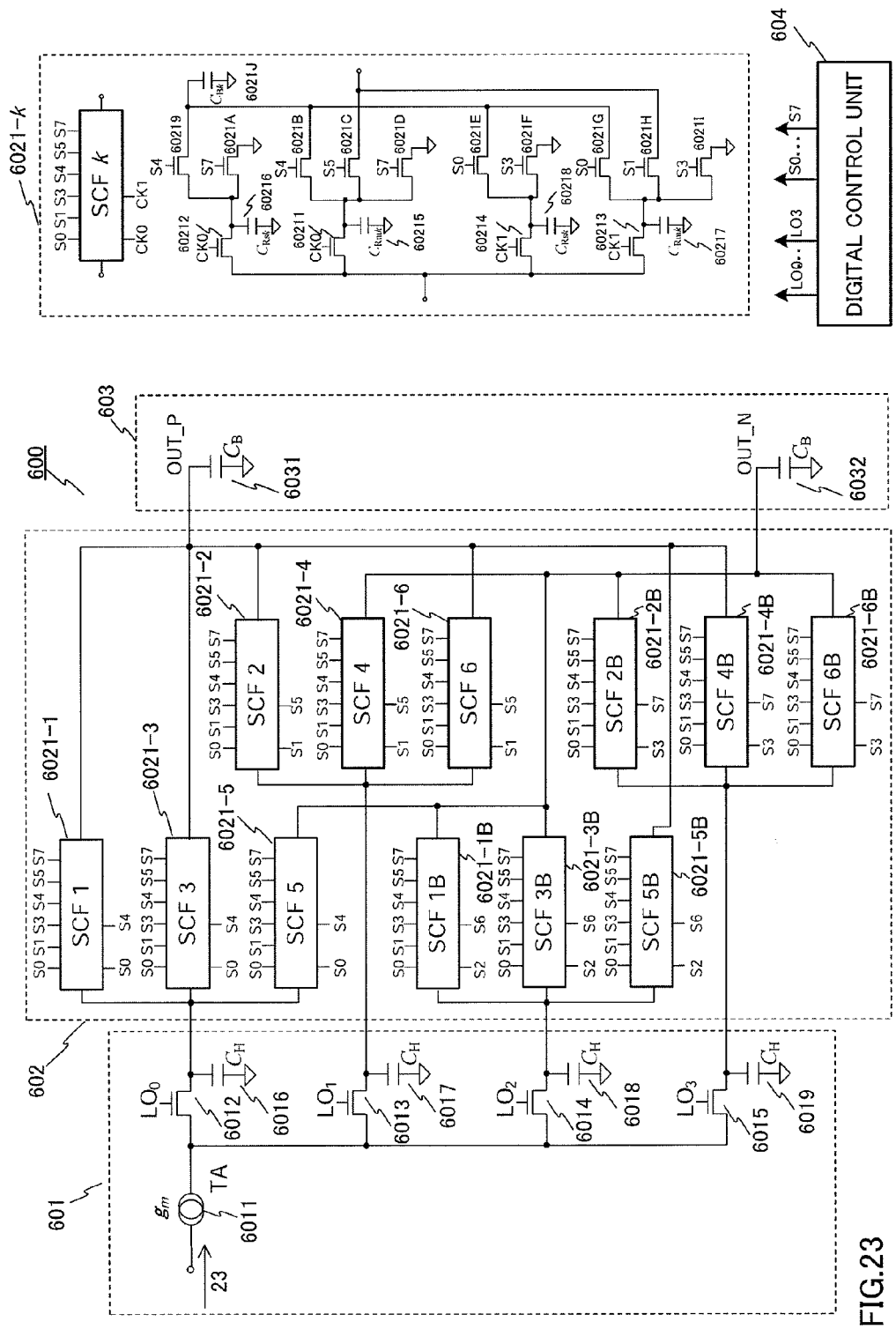
FIG. 23 is a connection diagram showing a configuration of a sampling circuit according to Embodiment 6 of the present invention.

FIG. 23 shows the configuration of sampling circuit 600 according to the present embodiment. First, the configuration of sampling circuit 600 will be explained, and next, the operation of sampling circuit 600 will be explained.

Sampling circuit 600 has IQ generating circuit 601, discrete time circuit 602, output adding circuit 603 and digital control unit 604.

IQ generating circuit 601 has TA (transconductance amplifier) 6011, sampling switches 6012 to 6015 and history capacitors 6016 to 6019.

Discrete time circuit 602 has rotate capacitor units 6021-1 to 6021-6 and 6021-1B to 6021-6B. Each of rotate capacitor units 6021-1 to 6021-6 and 6021-1B to 6021-6B has integration switches 60211 to 60214, main rotate capacitors 60215 and 60217, sub-rotate capacitors 60216 and 60218, buffer capacitor 6021J, release switch 6021A, 6021D, 6021F and 6021I, and dump switches 60219, 6021B, 6021C, 6021E, 6021G and 6021H.

Output adding circuit 603 has buffer capacitors 6031 and 6032.

The conductance value of history capacitors 6016 to 6019 in IQ generating circuit 601, the conductance value of main rotate capacitors 60215 and 60217, the conductance value of sub-rotate capacitors 60216 and 60218, and the conductance value of buffer capacitor 6021J in rotate capacitor unit 6021 and the conductance value of buffer capacitors 6031 and 6032 in output adding circuit 603, are set to values resulting in desired characteristics, respectively.

Digital control unit 604 outputs control signals LO0 to LO3 and S0 to S7 and supplies them to IQ generating circuit 601 and discrete time circuit 602.

Figure 24:
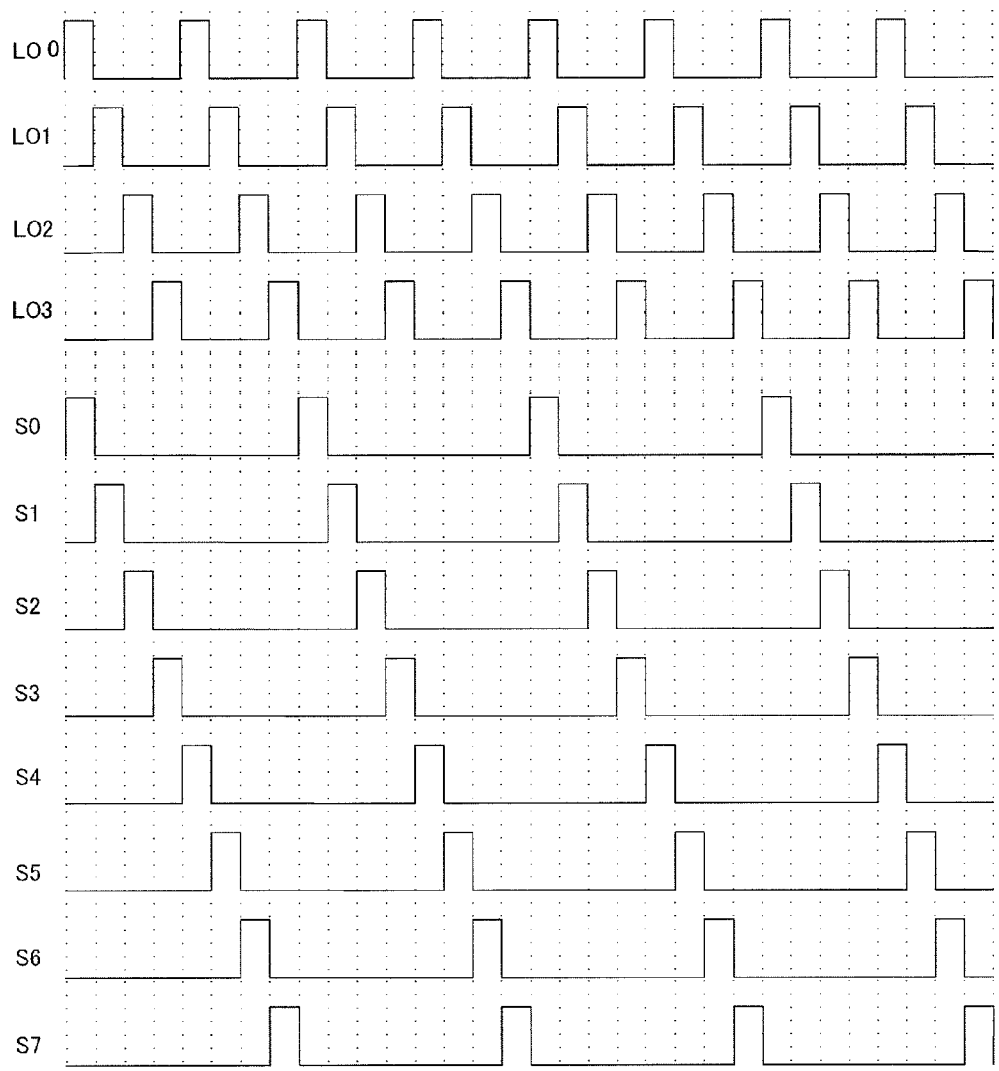
FIG. 24 is a timing chart explaining control signals according to Embodiment 6.

FIG. 24 shows a timing chart showing control signals outputted from digital control unit 604. LO0 to LO3 are four-phase signals, which have approximately the same period as that of an RF signal, are high at times shifted from each other, and have a high level period ¼ of an LO signal period. SO0 to SO7 are eight-phase signals, which have a period twice the period of LO0 to L03, are high at times shifted from each other and have a high level period equal to that of LO0 to L03.

Next, operation of sampling circuit 600 according to the present embodiment will be explained.

First, operation of IQ generating circuit 601 will be explained.

TA (transconductance amplifier) 6011 converts inputted analog RF signal 23 to an analog RF current signal and inputs the analog RF current signal to sampling switches 6012 to 6015. During LO0 to LO3 being in the high level, sampling switches 6012 to 6015 are turned on, and a current from TA (transconductance amplifier) 6011 is accumulated in history capacitors 6016 to 6019 to perform frequency conversion.

At this time, one of main rotate capacitors 60215 and 60217, and sub-rotate capacitors 60216 and 60218 in discrete time circuit 602 are simultaneously connected to TA (transconductance amplifier) 6011, so that electrical charge inputted to discrete time circuit 602 is accumulated in one of main rotate capacitors 60215 and 60217, and sub-rotate capacitors 60126 and 60218.

Next, operation of discrete time circuit 602 and operation of output adding circuit 603 will be explained. First, paying attention to rotate capacitor unit 6021, operation at the timings S0, S1 and S3 enter the high level period will be explained.

At the timing CK0, which is one of S0, S1 and S3, enters the high level period, inputted electrical charge is accumulated in main rotate capacitor 60215 and sub-rotate capacitor 60216 via integration switches 60211 and 60212 to perform input operation. At the same time, on the other hand, main rotate capacitor 60217 and sub-rotate capacitor 60218 perform weighting and output operation.

At the timing S0 enters the high level period, main rotate capacitor 60217, sub-rotate capacitor 60218 and buffer capacitor 6021J share electrical charge via dump switches 6021G and 6021E. Buffer capacitor 6021J holds the electrical one timing before, so that IIR filtering and weighting are performed.

Next, at the timing S1 enters the high level period, main rotate capacitor 60217 is connected to one of buffer capacitors 6031 and 6032 in output adding circuit 603 via dump switch 6021H to perform electrical charge sharing. Buffer capacitors 6031 and 6032 hold the electrical one timing before, so that IIR filtering operation is performed and output values are obtained.

Finally, at the timing S3 enters the high level period, main rotate capacitor 60217 and sub-rotate capacitor 60218 are grounded to reset via release switches 6021I and 6021F.

Next, operation at the timings S4, S5 and s7 enter the high level period.

At the timing CK1, which is one of S4, S5 and S7, enters the high level period, inputted electrical charge is accumulated in main capacitor 60217 and sub-rotate capacitor 60218 via integration switches 60213 and 60214 to perform input operation. At the same time, on the other hand, main rotate capacitor 60215 and sub-rotate capacitor 60216 perform weighting and output operation.

At the timing S4 enters the high level period, main rotate capacitor 60215, sub-rotate capacitor 60216 and buffer capacitor 6021J share electrical charge via dump switches 6021B and 60219. Buffer capacitor 6021J holds the electrical one timing before, so that IIR filtering and weighting are performed.

Next, at the timing S5 enters the high level period, main rotate capacitor 60215 is connected to one of buffer capacitors 6031 and 6032 in output adding circuit 603 via dump switch 6021C to perform electrical charge sharing. Buffer capacitors 6031 and 6032 hold the electrical one timing before, so that IIR filtering operation is performed to obtain output values.

Finally, at the timing S7 enters the high level period, main rotate capacitor 60215 and sub-rotate capacitor 60216 are grounded to reset, via release switches 6021D and 6021A.

Rotate capacitor unit 6021 repeats the above-described steps.

A plurality of rotate capacitor units 6021-$k$ ($k$=1 to 6) simultaneously connect to one of buffer capacitors 6031 and 6032 to perform electrical charge sharing, so that it is possible to realize a sum of transfer functions.

Here, in FIG. 23, paying attention to that six kinds of twelve rotate capacitor units are provided, a summary of a circuit configuration to provide a characteristic in which each three of rotate capacitor units are connected in parallel after electrical charge is added, will be explained.

Assume that input of rotate capacitor units 6021-1, 6021-3 and 6021-5 is represented as K. Therefore, it is possible to represent input of rotate capacitor units 6021-1, 6021-4 and 6021-6, as jK. In addition, it is possible to represent input of rotate capacitor units 6021-1B, 6021-2B and 6021-3B, as −K. Moreover, it is possible to represent input of rotate capacitor units 6021-2B, 6021-4B and 6021-6B, as −jK.

Assume that weighting by each number is performed, the output value of buffer capacitor 6031 in output adding circuit 603 is (K1+jK2)+(K3−jK4)+(−K5+jK6), so that it is understood that the output value of buffer capacitor 6032 is (−K1−jK2)+(−K3+jK4)+(K5−jK6). That is, it is understood that the sum of three complex numbers is outputted in the positive and negative phases.

Although, a configuration is shown in FIG. 23 where rotate capacitor units 6021-4 and 6021-5 represent negative coefficients, it is possible to switch between positive and negative coefficients of rotate capacitor unit 6021-$k$ by switching connection between rotate capacitor units 6021-$k$ and 6021-$k$B, and buffer capacitors 6031 and 6032.

Here, although a case of a complex discrete time circuit including rotate capacitor units, each three of which is connected in parallel, is shown in FIG. 23, it is possible to realize a complex discrete time circuit including m rotate capacitor units connected in parallel by using m pairs of positive and negative rotate capacitor units 6021-$k$ (m is any positive integer).

It is possible to represent the entire transfer function by the following equation 17, by calculation and organization using a difference equation and Z-transform.

(Equation 17)

$$T = \frac{g_m T_{LO}}{\pi\sqrt{2}} \cdot \frac{1}{\sum_{k=1}^{n}(C_{Rm(2k-1)} + C_{Rs(2k-1)}) + C_H(1-z^{-1})} \cdot$$

$$\frac{1}{\sum_{k=1}^{2n} C_{Rmk} + C_B(1-z^{-1})}$$

$$\sum_{k=1}^{n}\left(\frac{\pm C_{Rm(2k-1)}(C_{Rm(2k-1)} + C_{Rs(2k-1)})}{C_{Rm(2k-1)} + C_{Rs(2k-1)} + C_{Bk}(1-z^{-1})} + \frac{\pm j C_{Rm(2k)}(C_{Rm(2k)} + C_{Rs(2k)})}{C_{Rm(2k)} + C_{Rs(2k)} + C_{Bk}(1-z^{-1})}\right)$$ [12]

Here, $T_{LO}$ is the sampling period defined by a local signal LO inputted to sampling switches 6012 to 6015, and $g_m$ is the transconductance value of TA (transconductance amplifier) 6011. In addition, $C_H$ is the capacitance value of history capacitors 6016 to 6019. In addition, $C_{Rmk}$ is the capacitance value of main rotate capacitors 60215 and 60217 in rotate capacitor unit 6021-$k$. Moreover, $C_{Rsk}$ is the capacitance value of sub-rotate capacitors 60216 and 60218 in rotate capacitor unit 6021-$k$. Furthermore, $C_{Bk}$ is the capacitance value of buffer capacitor 6021J in rotate capacitor unit 6021-$k$.

Here, equation 17 is described by assuming that there are n rotate capacitor units 6021 (n is any positive integer) and ± is used because it is possible to change coefficients of the sum of first-order IIR transfer functions by switching connection between rotate capacitor units 6021-$k$ and 6021-$k$B, and buffer capacitors 6031 and 6032.

In addition, in equation 17, equation 18 is assumed for ease of mathematical expression.

(Equation 18)

$$\sum_{k=1}^{n}(C_{Rm(2k-1)} + C_{Rs(2k-1)}) = \sum_{k=1}^{n}(C_{Rm(2k)} + C_{Rs(2k)})$$ [13]

By using the design technique for setting attenuation poles shown in Embodiment 2, it is possible to freely set attenuation poles in bilateral symmetric or asymmetric positions centered around a sampling frequency.

Figure 25:
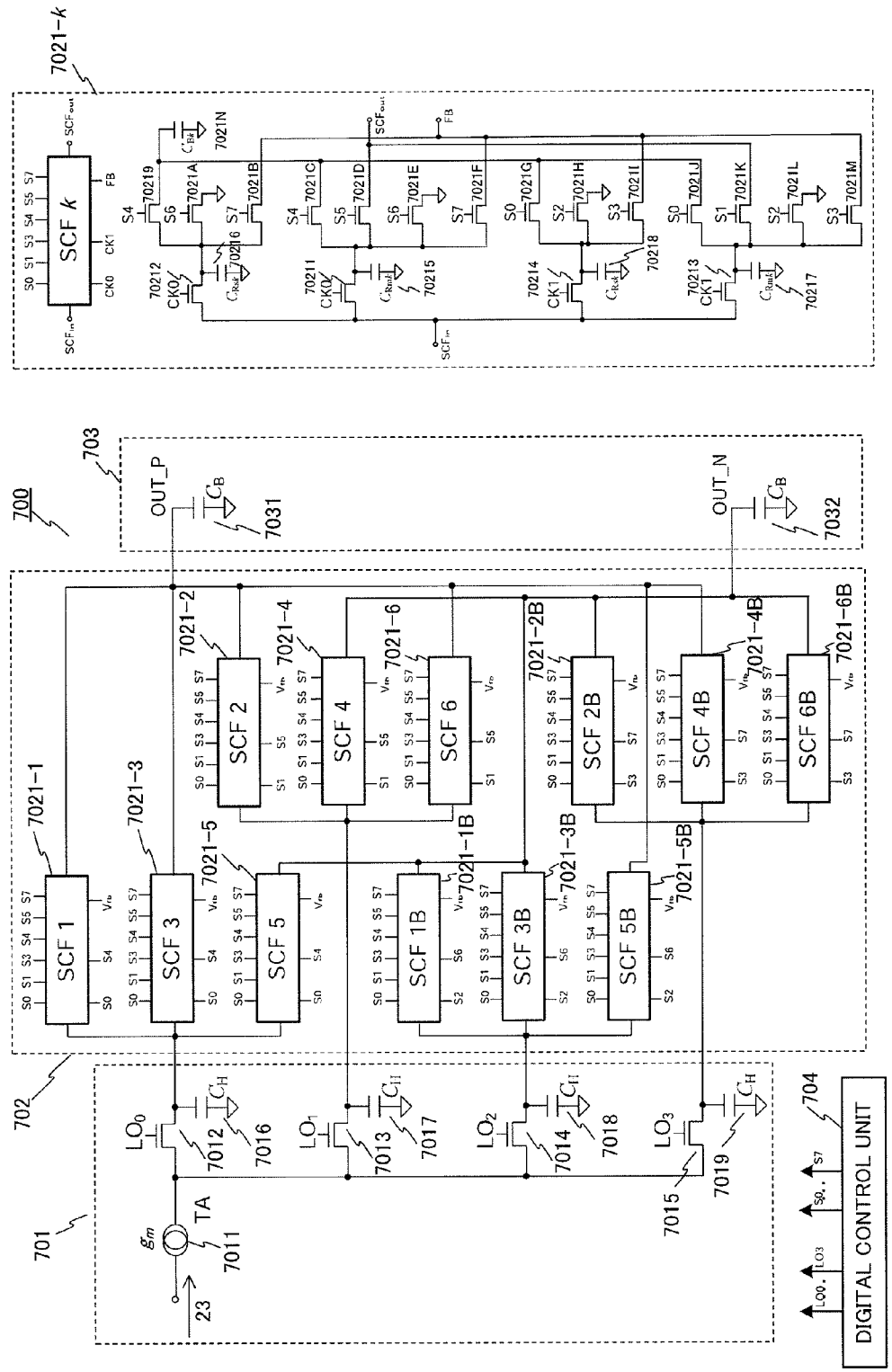
FIG. 25 is a connection diagram showing another configuration of the sampling circuit according to Embodiment 6.

In addition, it is possible to improve linearity by adopting the configuration shown in FIG. 25. In the configuration shown in FIG. 25, which has many components in common with the configuration of FIG. 23, such common components are identified (in FIG. 25) by reference characters increased by one hundred with respect to the similar component illustrated in FIG. 23. For example the sampling circuit 600 of FIG. 23 corresponds to the sampling circuit 700 and the IQ generating circuit 601 of FIG. 23 corresponds to circuit 701. In FIG. 25 charging switches 7021B, 7021F, 70211 and 7021M are added to the configuration shown in FIG. 23, and main rotate capacitors and sub-rotate capacitors are connected to FB terminals at specific timings. Reference voltage (current) Vfb to define the initial voltage is inputted to FB terminals. As operation, by providing the timing to connect to the FB terminal after resetting electrical charge in main rotate capacitors and sub-rotate capacitors, precharge in main rotate capacitors and sub-rotate capacitors are performed.

According to the present embodiment, it is possible to realize a complex discrete time circuit configuration including each set of rotate capacitor units connected in parallel, with a single TA (transconductance amplifier), so that it is possible to obtain filter characteristics which are little influenced from variations in gm of the TA (transconductance amplifier) and assure high accuracy in semiconductor manufacturing process. Moreover, it is possible to reduce power consumption by reducing the number of TAs (transconductance amplifiers).

INDUSTRIAL APPLICABILITY

The sampling circuit and the receiver according to the present invention are useful for a high-frequency signal processing circuit in the receiving section in a radio communication apparatus and are appropriate for signal frequency conversion and filtering processing.

REFERENCE SIGNS LIST

10 Sampling receiver
12 LNA (low noise amplifier)
13, 100, 200, 400, 600 Sampling circuit
14 Local frequency oscillating section
15 A/D (analog to digital) converting section
16 Digital reception processing section
101, 401, 601, 701, 2011 IQ generating circuit
102 electrical charge sharing circuit
102-1 to 102-$n$, 2012, 402, 602 Discrete time circuit
103, 303, 403, 603 Output adding circuit
104, 304, 404, 604 digital control unit
1011, 4011, 6011, 7011 TA (transconductance amplifier)
1012 to 1015, 4012 to 4015, 6012 to 6015, 7012 to 7015 Sampling switch
1016 to 1019, 4016 to 4018, 6016 to 6019, 7016 to 7019 History capacitor
1021, 302, 6021-1 to 6021-6, 6021-1B to 6021-6B, 7021-1 to 7021-6, 7021-1B to 7021-6B Rotate capacitor unit
1022, 1032, 3031, 4031 to 4033, 60219, 6021B, 6021C, 6021E, 6021G, 6021H, 70219, 7021C, 7021D, 7021G, 7021J, 7021K Dump switch
1023, 3032 Reset switch
10211, 10212, 3021, 3022, 4021 to 4023, 60211 to 60214, 70211 to 70214 Integration switch
10215, 3025, 4031 to 4033, 6021A, 6021D, 6021F, 6021I, 7021A, 7021E, 7021H, 7021L Release switch
201, 301 Complex discrete time circuit
202-1, 202-2, 3033, 4034, 6021J, 6031, 6032, 7021N, 7031, 7032 Buffer capacitor
300 Combined sampling circuit
301, 302 Complex electrical charge sharing circuit 3023, 10213, 60215, 60217, 70215, 70217 Main rotate capacitor
3024, 10214, 60216, 60218, 70216, 70218 Sub-rotate capacitor
501 Amplifier
502 Mixer filer
503 A/D converting circuit
504 Polyphase filter
505 Complex sampling circuit
7021B, 7021F, 7021I, 7021M Charging switch

The invention claimed is:

1. A sampling circuit comprising:
an in-phase and quadrature (IQ) generating circuit that outputs an in-phase (I) signal and a quadrature (Q) signal having phases 90 degrees shifted from one another, by sampling an input signal;
a plurality of discrete time of circuits connected to an output stage of the IQ generating circuit in parallel and performs weighting of outputs from the IQ generating circuit;
an adding circuit that is connected to an output stage of the plurality of discrete time circuits and adds outputs from each of the discrete time circuits which have performed weighting by electrical charge sharing of the discrete time circuits; and
a digital controller that outputs control signals to control operation of the discrete time circuits and operation of the adding circuit; wherein
each of the discrete time circuits has a rotate capacitor unit connected to one of I+, Q+, I− and Q− output stages of the IQ generating circuit and a dump switch directly connected to an output stage of the rotate capacitor unit.

2. The sampling circuit according to claim 1, wherein:
the IQ generating circuit includes:
one transconductance amplifier that converts an inputted voltage signal to a current signal and outputs the current signal;
four sampling switches connected to an output stage of the transconductance amplifier; and
four capacitors connected to respective output stages of the four sampling switches, and
a period of time in which the sampling switches are turned on is ¼ of a desired signal period, and a timing the sampling switch changes from off to on is shifted by ¼ of the desired signal period between each sampling switch, so that a period of time in which each sampling switch is turned on, does not overlap.

3. The sampling circuit according to claim 1, wherein:
the IQ generating circuit includes:
two transconductance amplifiers, each converting an inputted voltage signal to a current signal and outputting the current signal;
four sampling switches, each two sampling switches connected to output stages of the two transconductance amplifiers; and
four capacitors connected to respective output stages in the four sampling switches,
a period of time in which the sampling switches are turned on is ½ of a desired signal period, and, timings that the two sampling switches connected to one transconductance amplifier, of the four sampling switches, change from on to off, are shifted by ½ of the desired signal period, so that respective periods of time in which the two sampling switches are tuned on, do not overlap; and
a timing that the two sampling switches connected to one of the transconductance amplifiers change from on to off is shifted by ¼ of the desired signal frequency, from a timing that the two sampling switches connected to the other transconductance amplifier change from on to off.

4. The sampling circuit according to claim 1, wherein the directive time circuits connected to an output stage of the rotate capacitor unit include a reset switch.

5. The sampling circuit according to claim 1, wherein each of the plurality of electrical charge sharing circuits has a first-order infinite impulse response (IIR) filter characteristic.

6. The sampling circuit according to claim 1, wherein:
the adding circuit has a buffer capacitor, and
by integrating electrical charge inputted to the adding circuit, in the buffer capacitor, an adding result of inputted electrical charge is defined as output of the adding circuit.

7. A combined sampling circuit comprising:
a plurality of complex electrical charge sharing circuits, each including the sampling circuit according to claim 1;
a plurality of rotate capacitor units connected to an output stage of the complex electrical charge sharing circuit;
an adding circuit that is provided behind an output stage of the plurality of rotate capacitor units and adds outputs from the plurality of rotate capacitor units; and
a digital controller that outputs control signals to control operation of the complex electrical charge sharing circuit, operation of the rotate capacitor units, and operation of the adding circuit.

8. A receiver comprising:
the sampling circuit according to claim 1;
an antenna that receives an input signal;
a low noise amplifier that amplifies the signal received by the antenna and outputs an amplified signal to the sampling circuit; and
an analog to digital converter that analog-to digital-converts a baseband signal outputted from the sampling circuit and outputs a digital baseband signal.

9. The sampling circuit according to claim 1, wherein:
each rotate capacitor unit has a main rotate capacitor outputting a part of input electric charge and a sub-rotate capacitor resetting a part of input electric charge.

10. The sampling circuit according to claim 1, wherein:
each rotate capacitor unit has a main rotate capacitor, a sub-rotate capacitor and a buffer capacitor.

11. The sampling circuit according to claim 1, wherein:
each discrete time circuit has two sets each comprising a rotate capacitor unit, a dump switch and reset switch.

12. The sampling circuit according to claim 1, wherein:
the IQ generating circuit and the plurality of discrete time circuits comprise a complex discrete time circuit; and
the adding circuit adds outputs from each of the plurality of complex discrete time circuits.

13. The sampling circuit according to claim 4, wherein:
the rotate capacitor unit has an integration switch, a main rotate capacitor, a sub-rotate capacitor and a release switch; and
at a timing that input electrical charge is inputted to the rotate capacitor unit, the main rotate capacitor unit and the sub-rotate capacitor unit are connected in parallel via the integration switch, and, at a timing that electrical charge is outputted from the rotate capacitor unit, only the main rotate capacitor unit is connected to the release switch to determine output.

14. The combined sampling circuit according to claim 7, wherein:
the rotate capacitor unit has an integration switch, a main rotate capacitor, a sub-rotate capacitor and a release switch;

at a timing that input electrical charge is inputted to the rotate capacitor unit, the main rotate capacitor unit and the sub-rotate capacitor unit are connected in parallel via the integration switch, and, at a timing that electrical charge is outputted from the rotate capacitor unit, only the main rotate capacitor unit is connected to the release switch to determine output.

15. The combined sampling circuit according to claim 7, wherein:
the adding circuit has a dump switch, a reset switch and a buffer capacitor; and
by integrating electrical charge inputted to the adding circuit, in the buffer capacitor, a result of adding the inputted electrical charge is outputted.

16. The combined sampling circuit according to claim 7, wherein the sampling circuit is operated by only four-phase clocks which have a period corresponding to a desired signal period, have a high level period ¼ of the desired signal period, are shifted from each other by ¼ of the desired signal period and have respective high level periods shifted from each other.

17. The sampling circuit according to claim 9, wherein:
at an input timing, electrical charge of a sampling signal is integrated by the main rotate capacitor and the sub-rotate capacitor; and
at an output timing, the main rotate capacitor shares electrical charge with a buffer capacitor in the adding circuit and the sub-rotate capacitor is reset.

18. The sampling circuit according to claim 10, wherein:
at an input timing, electrical charge of a sampling signal is integrated by the main rotate capacitor and the sub-rotate capacitor; and
at an output timing, the main rotate capacitor, the sub-rotate capacitor and the buffer capacitor share electrical charge and weighting is performed.

19. A sampling circuit comprising:
an in-phase and quadrature (IQ) generating circuit that outputs an in-phase (I) signal and a quadrature (Q) signal having phases 90 degrees shifted from one another, by sampling an input signal;
a plurality of electrical charge sharing circuits connected to an output stage of the IQ generating circuit in parallel;
an adding circuit that is positioned behind an output stage of the plurality of electrical charge sharing circuits and adds outputs from the electrical charge sharing circuits; and
a digital controller that outputs control signals to control operation of the electrical charge sharing circuits and operation of the adding circuit; wherein:
the IQ generating circuit includes:
two transconductance amplifiers, each converting an inputted voltage signal to a current signal and outputting the current signal;
four sampling switches, each two sampling switches connected to output stages of the two transconductance amplifiers; and
capacitors connected to respective output stages of the four sampling switches,
a period of time in which the sampling switches are turned on is ½ of a desired signal period, and, timings that two sampling switches connected to one transconductance amplifier, of the four sampling switches, change from on to off, are shifted by ½ of the desired signal period, so that respective periods of time in which the two sampling switches are tuned on, do not overlap; and
a timing that the two sampling switches connected to the other of the transconductance amplifiers change from on to off is shifted by ¼ of the desired signal frequency, from a timing that the two sampling switches connected to the one transconductance amplifier change from on to off.

\* \* \* \* \*